United States Patent
Toyama et al.

(10) Patent No.: US 9,208,889 B2
(45) Date of Patent: Dec. 8, 2015

(54) NON-VOLATILE MEMORY INCLUDING BIT LINE SWITCH TRANSISTORS FORMED IN A TRIPLE-WELL

(71) Applicant: SanDisk Technologies Inc., Plano, TX (US)

(72) Inventors: Fumiaki Toyama, Cupertino, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/175,878

(22) Filed: Feb. 7, 2014

(65) Prior Publication Data

US 2014/0226415 A1    Aug. 14, 2014

Related U.S. Application Data

(60) Provisional application No. 61/762,783, filed on Feb. 8, 2013.

(51) Int. Cl.
*G11C 16/08* (2006.01)
*G11C 16/16* (2006.01)
*H01L 27/115* (2006.01)
*G11C 16/04* (2006.01)
*G11C 16/24* (2006.01)

(52) U.S. Cl.
CPC ............ *G11C 16/16* (2013.01); *G11C 16/0483* (2013.01); *G11C 16/24* (2013.01); *H01L 27/11517* (2013.01)

(58) Field of Classification Search
CPC ....................................................... G11C 16/24
USPC ....................................................... 365/185.18
See application file for complete search history.

(56) References Cited

U.S. PATENT DOCUMENTS

| | | | |
|---|---|---|---|
| 5,295,095 A | 3/1994 | Josephson | |
| 5,886,942 A | 3/1999 | Akita | |
| 5,898,616 A * | 4/1999 | Ono | 365/185.17 |
| 5,978,264 A * | 11/1999 | Onakado et al. | 365/185.11 |
| 6,038,170 A * | 3/2000 | Shiba | 365/185.13 |
| 6,243,292 B1 * | 6/2001 | Kobayashi et al. | 365/185.13 |
| 6,510,084 B2 * | 1/2003 | Ha | 365/185.25 |
| 6,570,786 B2 | 5/2003 | Lee | |
| 6,791,878 B2 | 9/2004 | Jeong | |
| 7,095,656 B2 | 8/2006 | Lee | |

(Continued)

OTHER PUBLICATIONS

International Search Report & The Written Opinion of the International Searching Authority dated May 9, 2014, International Application No. PCT/US2014/015406.

*Primary Examiner* — Son Mai
(74) *Attorney, Agent, or Firm* — Vierra Magen Marcus LLP

(57) ABSTRACT

Non-volatile memory and methods of operating non-volatile memory reduce breakdown and leakage associated with bit line (BL) switch transistors. The BL switch transistors for a memory array are formed in a well that is electrically isolated from a well associated with the memory array. The well of the BL switch transistors may be biased independently of the memory array well. A negative voltage is applied to the BL switch transistor well during programming and reading that creates a negative body bias that may reduce field punch-through leakage of the BL switch transistors. A positive voltage is applied to the BL switch transistor well during erasing that may reduce junction breakdown of the BL switch transistors.

22 Claims, 16 Drawing Sheets

(56) References Cited

U.S. PATENT DOCUMENTS

| | | |
|---|---|---|
| 7,411,824 B2 | 8/2008 | Shibata et al. |
| 7,733,696 B2 * | 6/2010 | Lee et al. ............... 365/185.05 |
| 7,903,470 B2 * | 3/2011 | Tseng et al. ............. 365/185.25 |
| 8,355,287 B2 * | 1/2013 | Hsu et al. ................ 365/185.22 |
| 2005/0265109 A1 | 12/2005 | Goda et al. |
| 2007/0014152 A1 | 1/2007 | Shibata et al. |
| 2009/0279359 A1 | 11/2009 | Goda et al. |
| 2010/0002522 A1 | 1/2010 | Park |
| 2010/0202214 A1 | 8/2010 | Yip |
| 2010/0315888 A1 | 12/2010 | Sato |
| 2011/0096602 A1 | 4/2011 | Kim et al. |
| 2013/0070531 A1 | 3/2013 | Zhao et al. |
| 2013/0107627 A1 | 5/2013 | Toyama et al. |

* cited by examiner

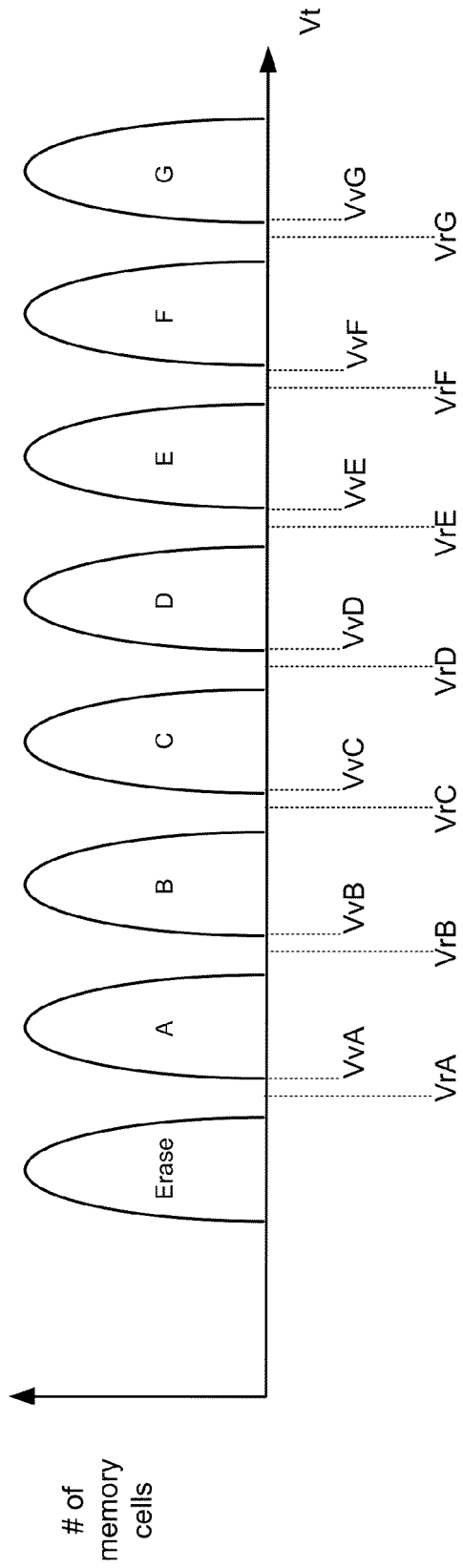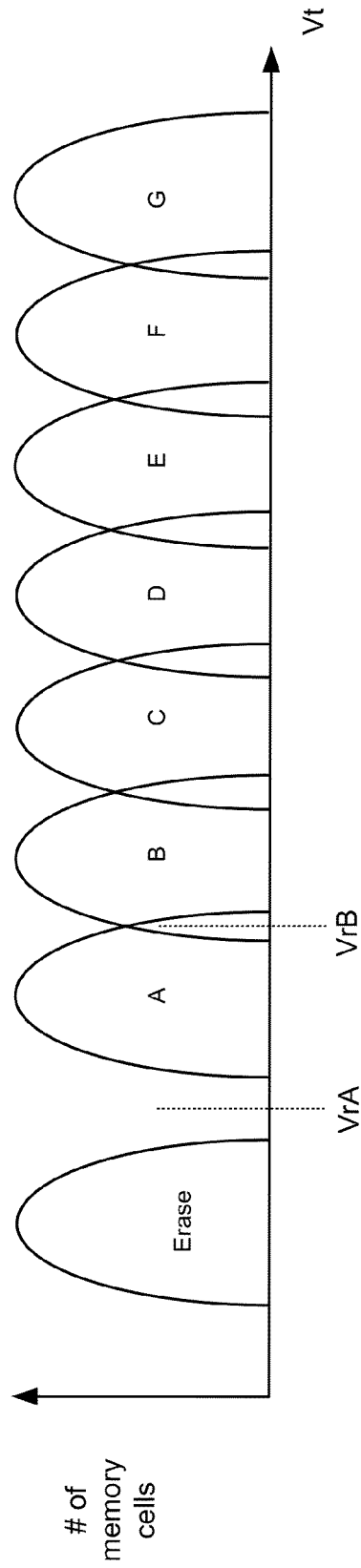

| | Program | Read | Erase |
|---|---|---|---|
| Vgate (BLS) | Vselect (8V) | Vselect (8V) | Vdeselect (2V) |
| Vbl (BL Terminal) | Vbl=Vsb (0/2.3V) | Vbl=Vsb (0/2V) | Vbl=Vera (20V) |
| Vsb (SB Terminal) | Vpe/Vpi (0/2.3V) | 0-Vpc (0/2V) | Vdeselect (2V) |

| | Program | Read | Erase |
|---|---|---|---|
| Vgate (BLS) | Vselect (8V) | Vselect (8V) | Vdeselect (2V) |
| Vbl (BL Terminal) | Vbl=Vsb (0/2.3V) | Vbl=Vsb (0/2V) | Vera (20V) |
| Vsb (SB Terminal) | Vpe/Vpi (0/2.3V) | 0/Vpc (0/2V) | Vdeselect (2V) |
| Vbl_p-well | Vnbb (-2V) | Vnbb (-2V) | Vpbb (2V) |

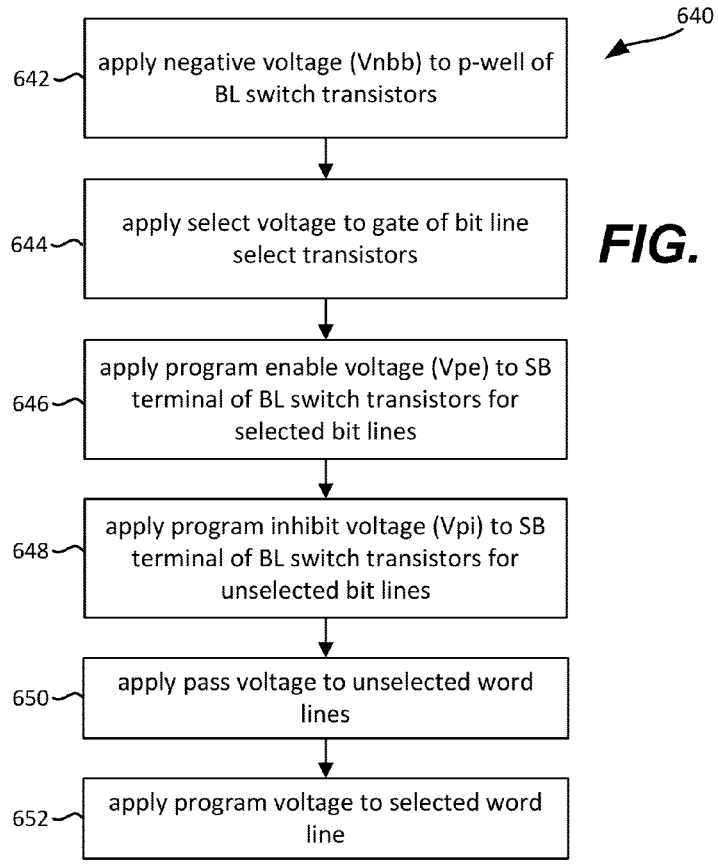
FIG. 14
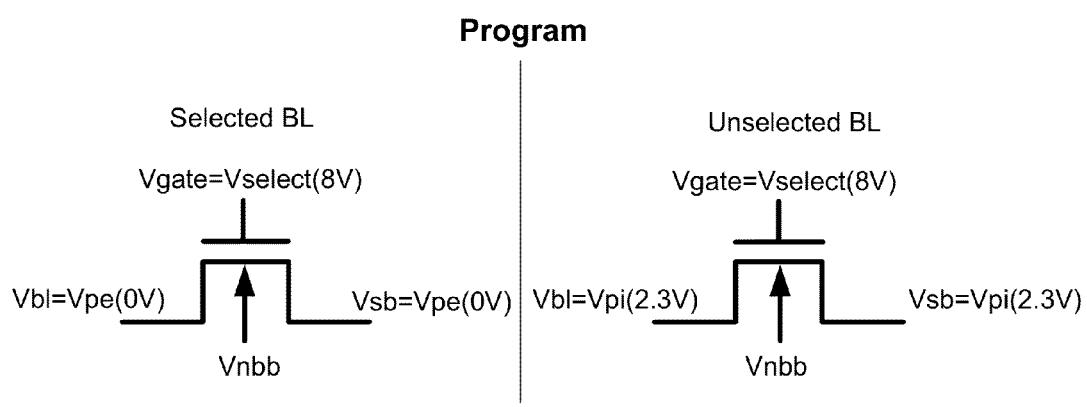
FIG. 15a  FIG. 15b

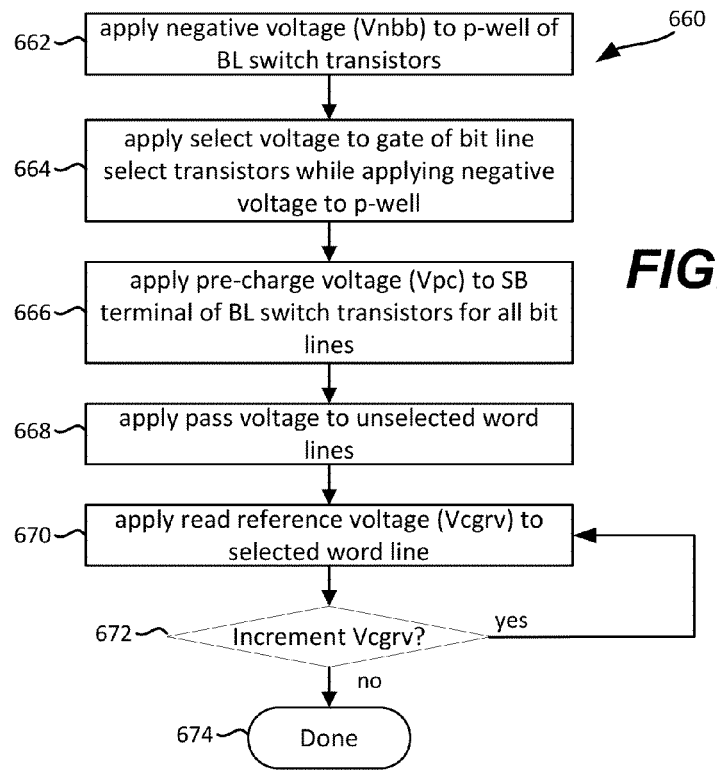
*FIG. 16*
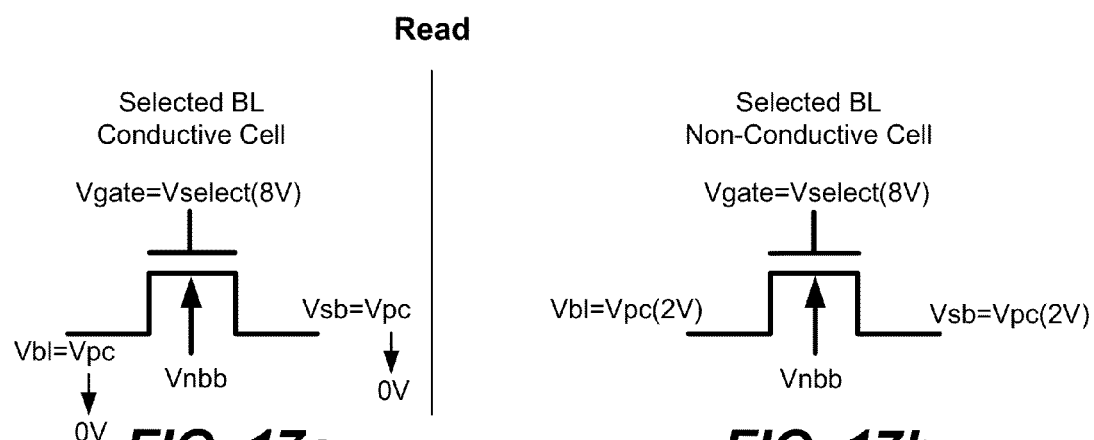
*FIG. 17a*  *FIG. 17b*

NON-VOLATILE MEMORY INCLUDING BIT LINE SWITCH TRANSISTORS FORMED IN A TRIPLE-WELL

CLAIM OF PRIORITY

The present application claims priority from U.S. Provisional Patent Application No. 61/762,783, entitled "Bias Conditions of BL Switch Transistor with Triple Well for NAND Memory," by Toyama et al., filed Feb. 8, 2013, incorporated by reference herein in its entirety.

BACKGROUND

The disclosed technology is related to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate (FG) that is positioned above and insulated from a channel region in a semiconductor substrate. The floating gate is positioned between the source and drain regions. A control gate (CG) is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage Vpgm is applied to the control gate during a program operation as a series of pulses that increase in magnitude over time. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed.

For some architectures, thousands of memory cells can be programmed, read, or erased at the same time. For example, with a NAND architecture the control gates of thousands of memory cells may be connected together into what is commonly referred to as a word line. Thus, by applying a program voltage to the word line, thousands of memory cells can be programmed at a time. Likewise, by applying a read voltage to the word line, thousands of memory cells can be read at a time. Similarly, by applying an erase voltage to a common well region for the memory cells a block of many memory cells may be erased.

A memory array may have many bit lines, each used as a control line for a different set of memory cells. During programming, a program enable or a program inhibit voltage may be applied to a bit line to facilitate or inhibit programming of a memory cell coupled to the bit line and a selected word line. For reading, a pre-charge voltage may be applied to the selected bit lines. During erasing, the bit line switch transistors may be turned off to isolate the bit lines.

One technique for applying the necessary voltages to the bit lines is through a bit line switch transistor that is connected to each bit line. Large voltages may be associated with the bit line switch transistors. For example, a high erase voltage may couple to the bit line terminal of a BL switch transistor during erasing or a high select voltage may be applied to the gates of the BL switch transistors during programming or reading. The operation of the bit line switch transistors at the necessary levels may cause problems with the transistors in traditional architectures.

BRIEF DESCRIPTION OF THE DRAWINGS

FIG. 7A is an example of threshold voltage distributions for memory cells storing data in eight states.

FIG. 7B is an example of threshold voltage distributions for memory cells storing data in eight states where the threshold voltage distributions overlap.

FIG. 14 is a flowchart describing a process of operating a non-volatile memory during a program operation in accordance with an embodiment.

FIGS. 15a-15b depict possible bias conditions applied to a bit line switch transistor during a program operation.

FIG. 16 is a flowchart describing a process of operating a non-volatile memory during a read operation in accordance with an embodiment.

FIGS. 17a-17b depict possible bias conditions applied to bit line switch transistor during a read operation.

DETAILED DESCRIPTION

A non-volatile memory and associated method of operating a non-volatile memory are provided. A memory structure is provided that facilitates applying a body bias to the bit line (BL) switch transistors for a memory array. Each BL switch transistor includes a sense block (SB) terminal in communication with a sense block and a bit line (BL) terminal in communication with a bit line. The gates of each BL switch transistor are tied to a common bit line select line (BLS) in one embodiment. The bit line switch transistors are formed in a well in the substrate that is electrically isolated from a well in which the memory array is formed. For example, the bit line switch transistors may be formed in a first triple well including a first well, a second well, and a substrate. The memory array may be formed in a second triple well including a third well, a fourth well and the substrate. The well of the BL switch transistors may be biased independently of the memory array well.

In one embodiment, a negative voltage is applied to the first well during programming and reading that creates a negative body bias that may reduce field punch-through leakage of the BL switch transistors. A positive voltage is applied to the first well during erasing that may reduce junction breakdown of the BL switch transistors.

Figure 1A:
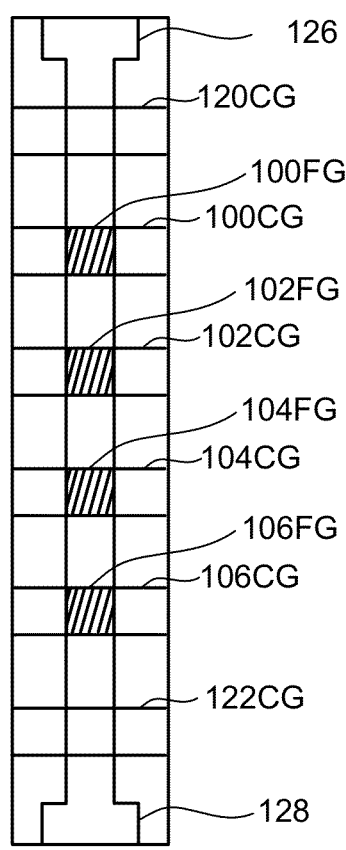
FIG. 1A is a top view of a NAND string.
Figure 1B:
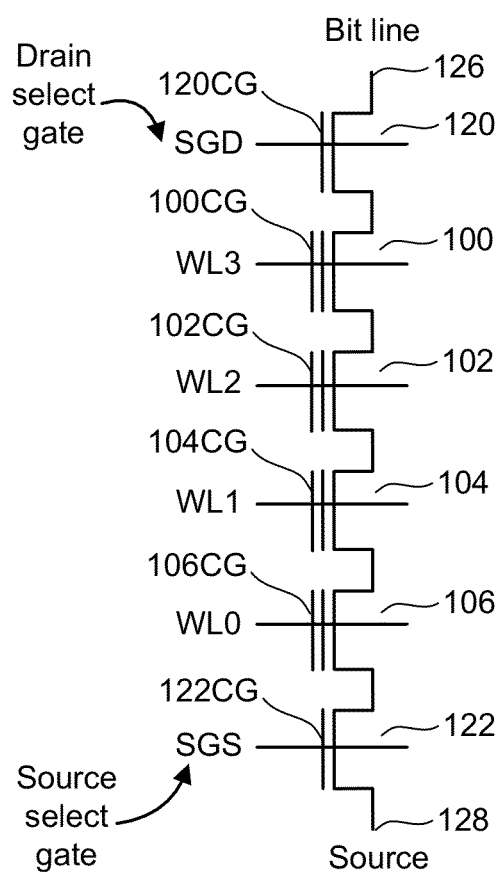
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 2:
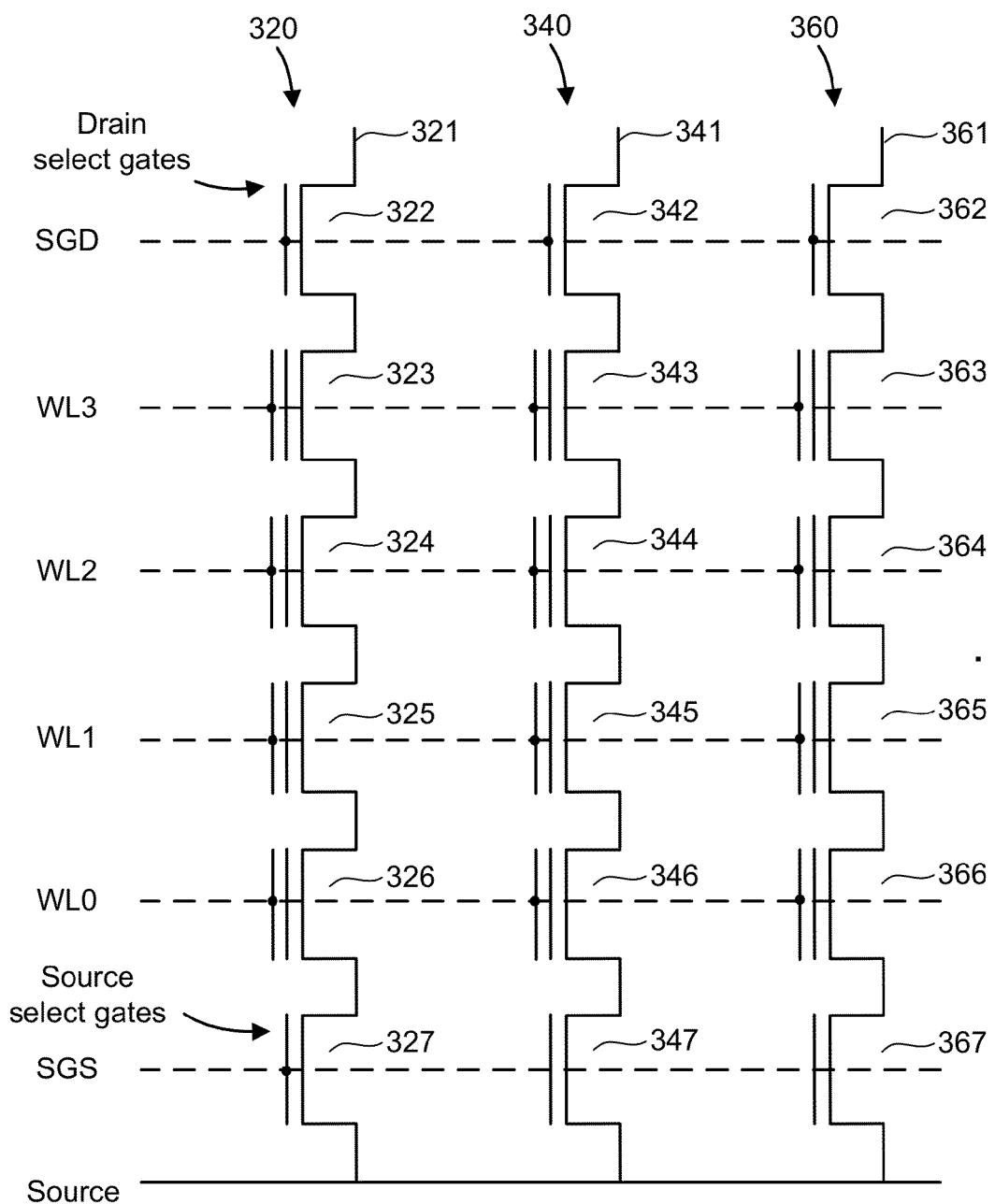
FIG. 2 is a circuit diagram depicting three NAND strings.

FIG. 2 is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation may be positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values may be used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Figure 3:
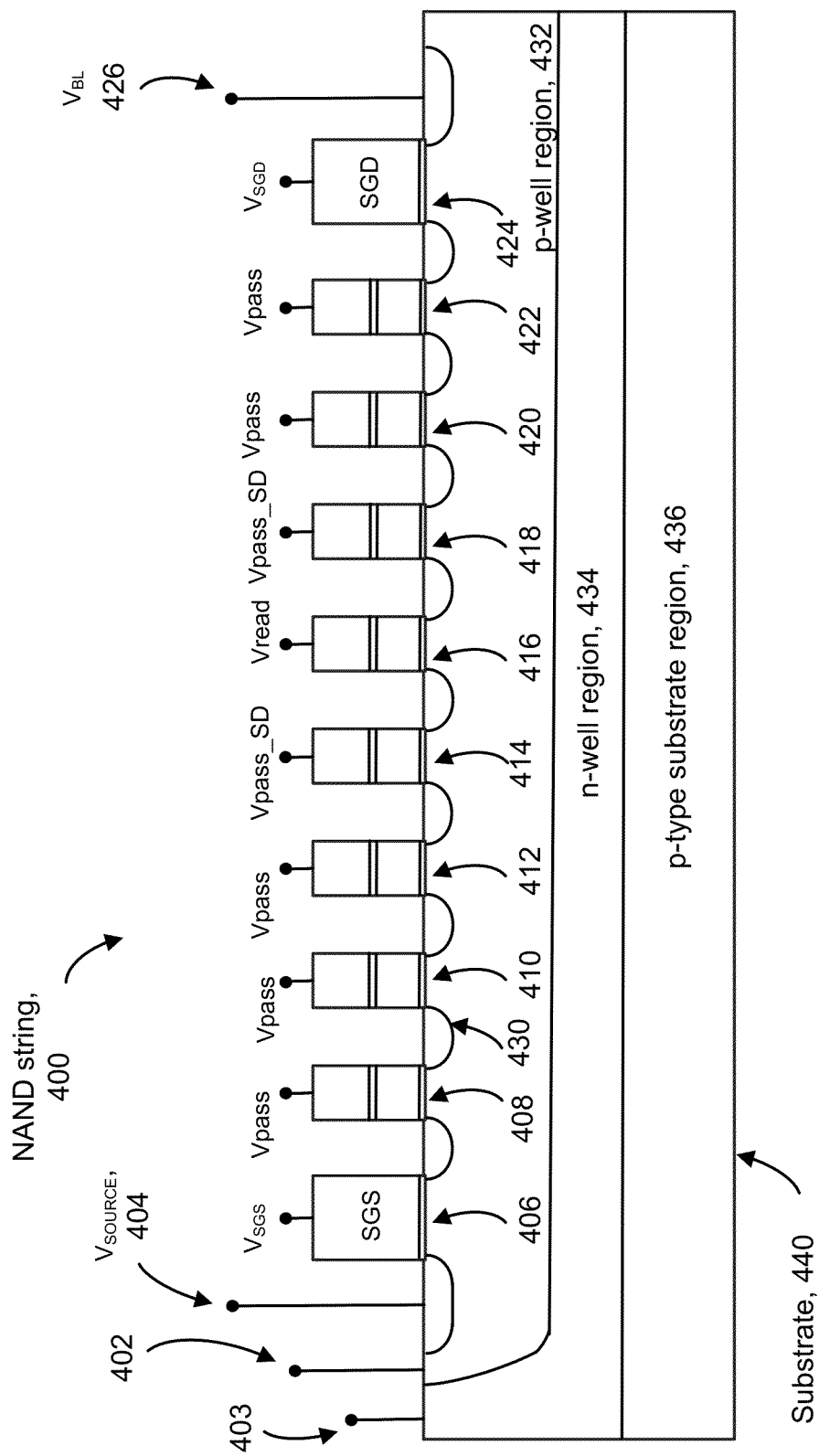
FIG. 3 is a cross-sectional view of a NAND string.

FIG. 3 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 440. A number of source/drain regions, one example of which is source/drain region 430, are provided on either side of each storage element and the select gates 406 and 424.

In one approach, the substrate 440 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403. During a read or verify operation, a control gate voltage Vread is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, Vpass is applied to at least some of the remaining word lines associated with NAND string 400, in this embodiment. Vpass is a standard or default pass voltage in one example. Note that pass voltage Vpass_SD is applied to the word lines that are adjacent to the selected word line. The level of this state-dependent (SD) pass voltage varies with the level of Vread to reduce read disturb that might otherwise occur on the memory cells that immediately neighbor the selected memory cell. Furthermore, the varying level of Vpass_SD also provides conduction through the channel region of NAND string 400 as needed during sensing. $V_{SGS}$ and $V_{SGD}$ are applied to the select gates 406 and 424, respectively.

During a program operation, a control gate voltage Vpgm is provided on a selected word line (e.g., WL3, which is associated with storage element 414). Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, Vpass is applied to the remaining word lines associated with NAND string 400, in one possible boosting scheme. VSGS and VSGD are applied to the select gates 406 and 424, respectively.

Figure 4:
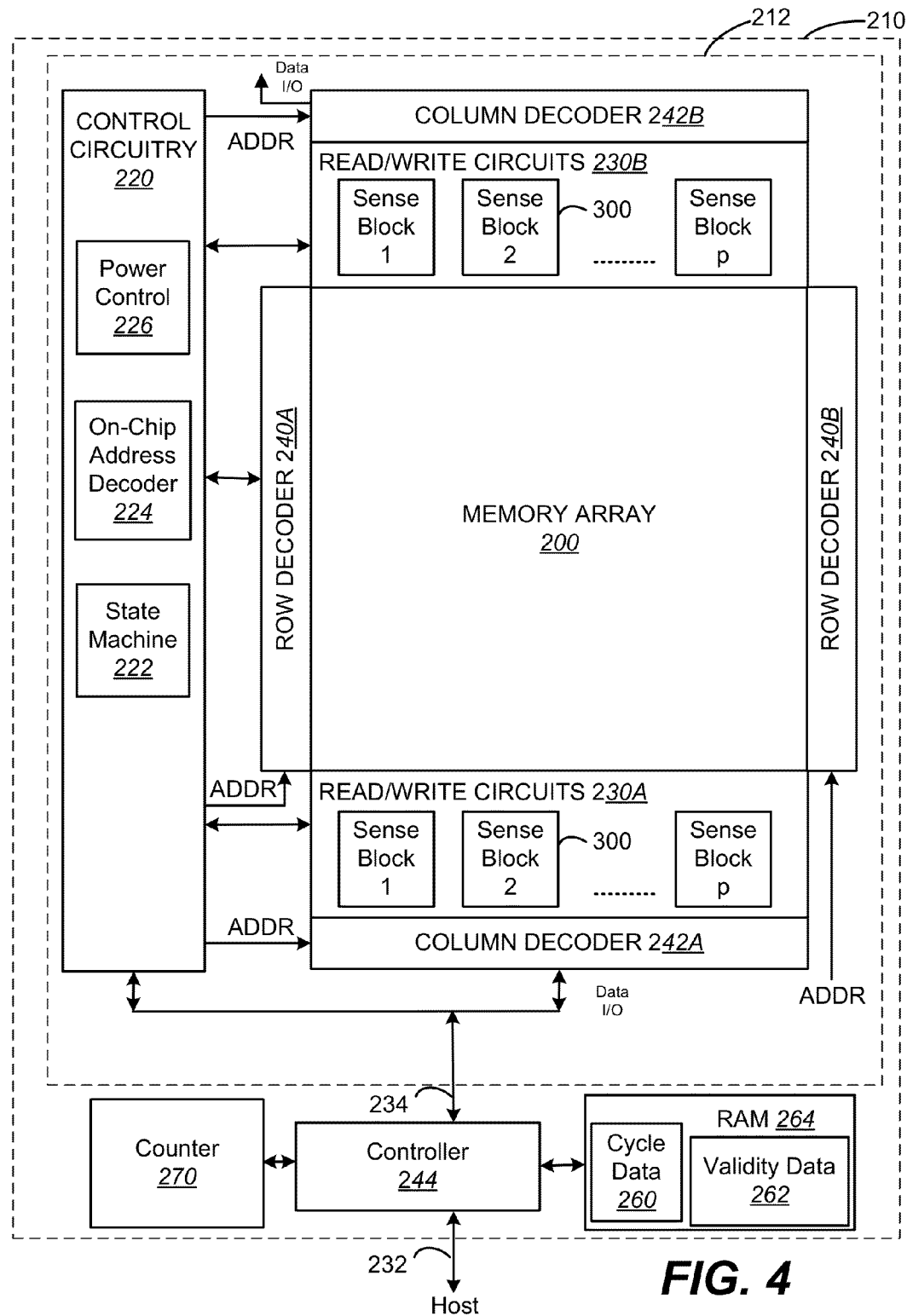
FIG. 4 is a block diagram of a non-volatile storage device that may include one or more memory die or chips.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
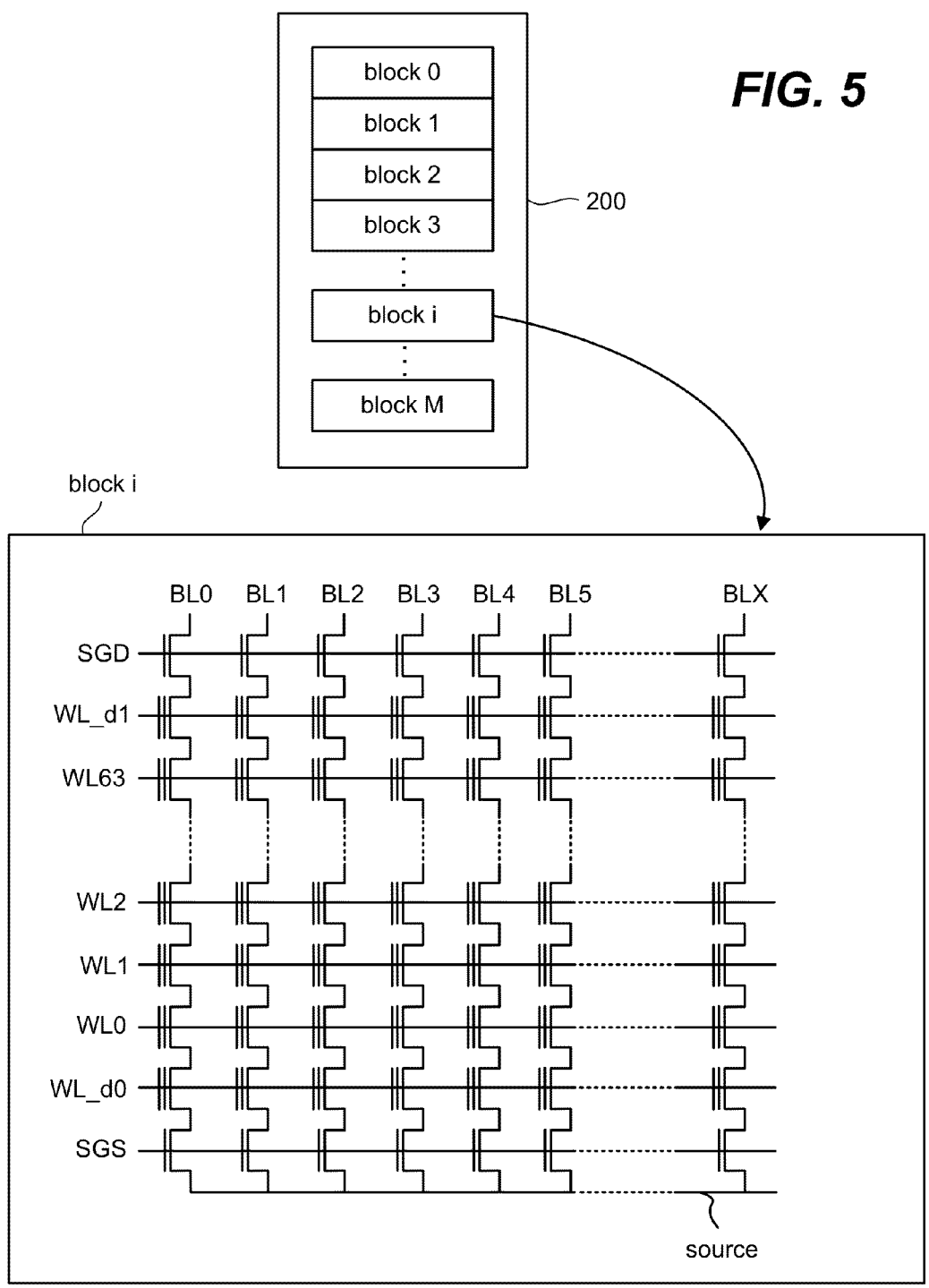
FIG. 5 is a block diagram depicting an exemplary structure of memory cell array.

FIG. 5 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
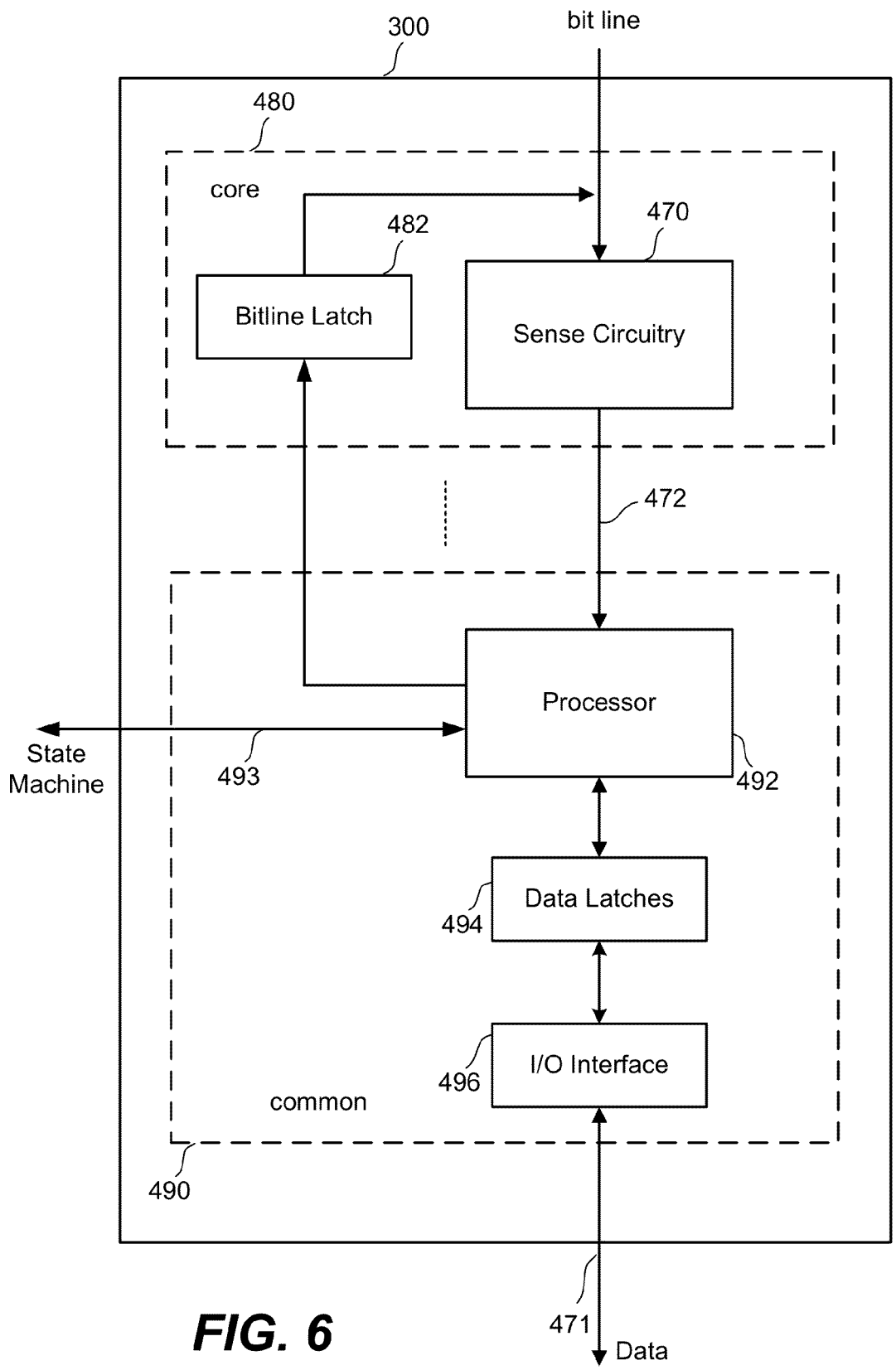
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 7A depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7A shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7A shows VvA for state A and VvB for state B, etc. When programming memory cells to a given state, the system will test whether those memory cells have a threshold voltage greater than or equal to the verify reference voltage.

FIG. 7B illustrates that Vt distributions can partially overlap since the error correction algorithm can handle a certain percentage of cells that are in error. Note that in some embodiments, at one point in time the threshold voltage distribution may resemble FIG. 7A and at another time the threshold voltage distributions may overlap, as in FIG. 7A. For example, just after programming, the threshold voltage distribution may resemble FIG. 7A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figures 8, 9:
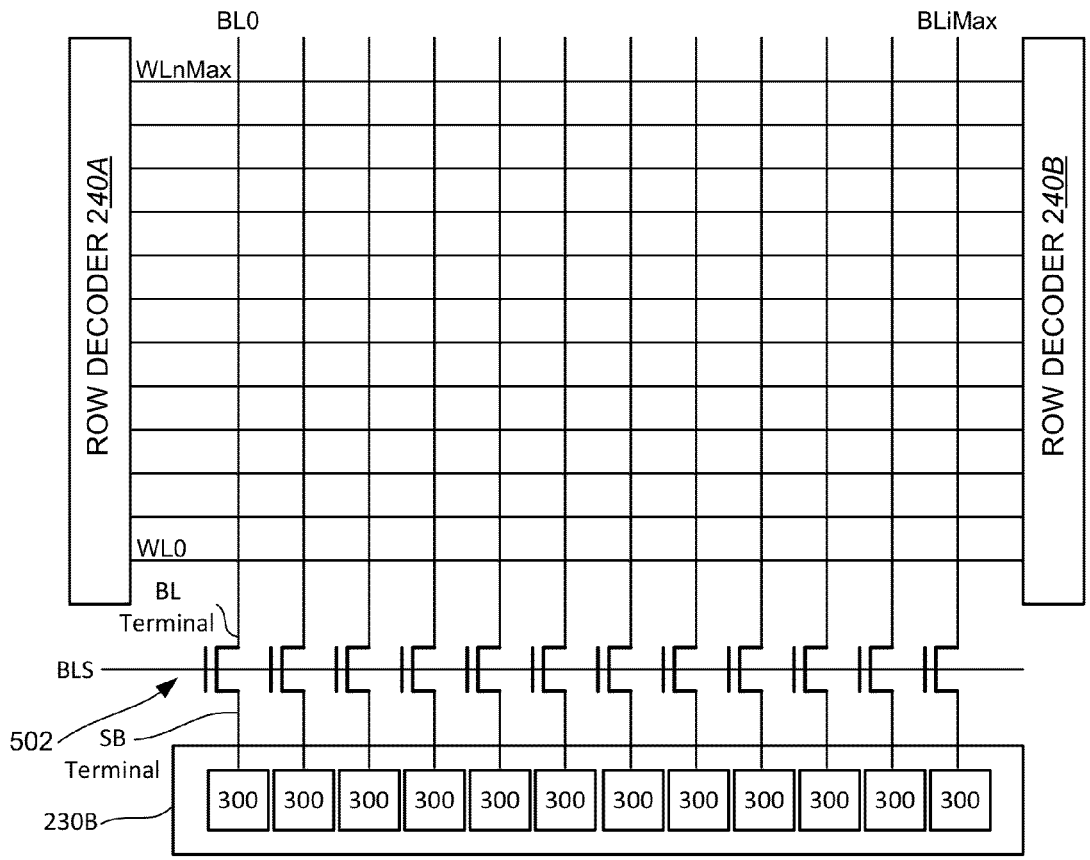
FIG. 8 depicts an example of a memory array structure including bit line switch transistors that connect bit lines to sense blocks.
FIG. 9 is a table of bias conditions for operating a bit line switch transistor.

FIG. 8 is a schematic diagram of a portion of one memory array, as shown in FIG. 5 for example, including associated read/write circuits 230A. Although a portion of a single block is depicted, typically there will be many more blocks within the memory array. Word lines WL0-WLnmax connect to row decoders 240A, 240B and bit lines BL0-BliMax connect to read write circuits 230B. Other read/write circuits 230A as shown in FIG. 4 are not depicted. Each bit line BL is in communication with an individual sense block 300 as shown in FIG. 6. It is noted that more than one bit line may be in communication with an individual sense block 300 in other examples. Each bit line is connected to a bit line switch transistor 502. The bit line is connected to a first terminal of the bit line switch transistor 502 and a second terminal of the bit line switch transistor is connected to the sense amplifier 300. In FIG. 8, the first terminal is generally denoted as the bit line (BL) terminal and the second terminal is denoted as the sense block line (SB) terminal A contact, via, or simple connection point in the semiconductor circuit may form the terminals. The gates of the BL switch transistors 502 for the block are connected together by a common bit line select line BLS. However, this not requirement. In this manner, a select voltage Vselect or deselect voltage Vdeselect can be applied to the gates of the BL switch transistors 502 for the block. By applying a select voltage to BLS, the BL switch transistors can be turned on to pass the voltage from the bit line to the sense amplifier or from the sense amplifier to the bit line. Although BL switch transistors 502 are shown apart from the read/write circuits 230B, the BL switch transistors 502 may be included in these circuits.

FIG. 9 is a table 501 showing an example of bias conditions for operating BL switch transistors 502 during program, read, and erase operations in one example. During programming, the gates of the BL switch transistors are biased to a select voltage Vselect by applying the select voltage on the bit line select line BLS. For example, Vselect may be 8V in one embodiment, but other select voltages may be used. In this manner, a voltage applied to a SB terminal of the transistor will be passed to the BL terminal of the transistor. The SB terminal of each BL switch transistor is connected to a sense block and is biased to Vsb by the corresponding sense block during programming. The BL terminal of each BL switch transistor is connected to a bit line BL and is biased to Vbl during programming. Because the select voltage Vselect is applied to BLS, the sense block voltage Vsb applied to the SB terminal is passed to the BL terminal such that Vbl=Vsb.

During programming, some of the bit lines are selected for programming, while other bit lines are not selected for programming. A program enable voltage Vpe is applied to selected bit lines during programming, while a program inhibit voltage Vpi is applied to unselected bit lines during programming. In one example, the program enable voltage Vpe is 0V or ground and the program inhibit voltage Vpi is 2.3V. Other voltages can be used to enable or inhibit programming in other embodiments. As shown in table 501, the BL switch transistors for the selected bit lines have the program enable voltage Vpe applied to their SB terminal by the corresponding sense blocks. The BL switch transistors for the unselected bit lines have the program inhibit voltage Vpi applied to their SB terminal by the corresponding sense blocks.

Figure 10A:
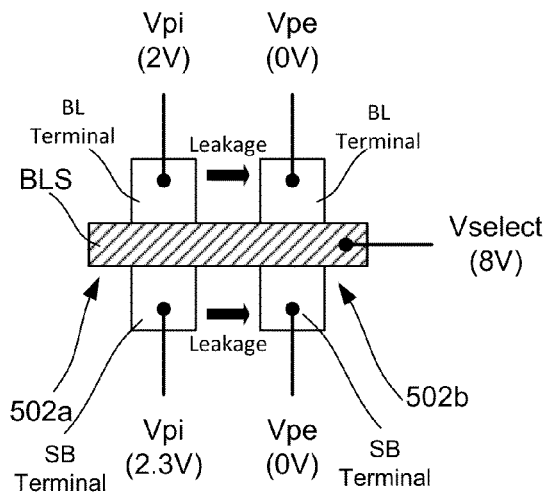
FIGS. 10a-10c are top schematic views of two adjacent bit line switch transistors depicting bias conditions for program, read, and erase operations.

FIG. 10a is a top schematic view of two adjacent bit line switch transistors 502a and 502b during an example of a program operation. In this example BL switch transistor 502a corresponds to a bit line that is being inhibited from programming during the program operation and BL switch transistor 502b corresponds to a bit line that is enabled for programming during the program operation. Select voltage Vselect is applied to the bit line select line BLS so that the voltage from the corresponding sense blocks that is applied at the SB terminal of each BL switch transistor passes to the BL terminal and the corresponding bit lines BL. The program inhibit voltage Vpi is applied to the SB terminal of BL switch transistor 502a and the program enable voltage Vpe is applied to the SB terminal of BL switch transistor 502b. With select voltage Vselect applied to the gates, the BL terminal of transistor 502a is raised to the program inhibit voltage (Vbl=Vpi)

and the BL terminal of transistor 502b is brought to the program enable voltage (Vbl=Vpe).

The bias conditions in FIGS. 9 and 10a result in a high potential (e.g., 2.3V) at the SB terminal and BL terminal of transistor 502a and a low potential (e.g., 0V) at the SB terminal and BL terminal of transistor 502b. With this bias, field punch-through leakage between these adjacent BL switch transistors may occur. Leakage may occur from the higher biased transistor 502a to the lower biased transistor 502b. While increasing the amount of well dopant may reduce the leakage, the increased dopant levels may degrade the junction breakdown voltage of the device, leading to more breakdown during erase as described hereinafter.

Figure 10B:
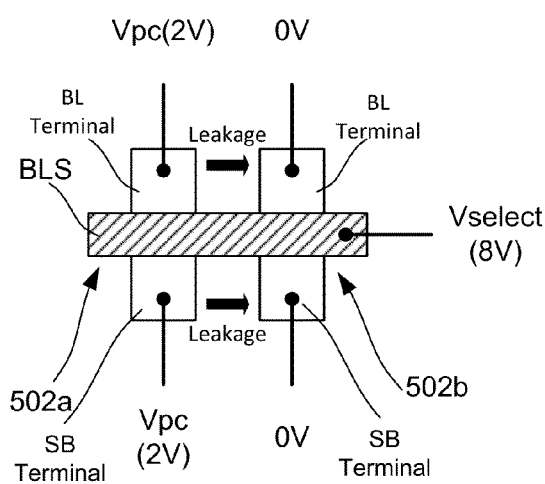

During reading, similar bias conditions for the BL switch transistors may be applied as during programming. As shown in FIG. 10b, the gates of the BL switch transistors are biased to the select voltage Vselect. The SB terminal of each BL switch transistor is biased to a pre-charge voltage Vpc to enable sensing for reading a corresponding memory cell. The pre-charge voltage Vpc is passed to the BL terminal of each BL switch transistor. In this example, BL switch transistor 502a corresponds to a bit line having a memory cell that has a threshold voltage above the read reference voltage being applied to the corresponding word line. BL switch transistor 502b corresponds to a bit line having a memory cell with a threshold voltage below the read reference voltage being applied to the corresponding word line. In this manner, the memory cell corresponding to BL switch transistor 502a will not be conductive during sensing such that the BL terminal voltage Vbl remains at the pre-charge voltage level Vpc. The memory cell corresponding to BL switch transistor 502b will be conductive during sensing such that the BL terminal voltage Vbl is discharged to ground or 0V during sensing. The conductive memory cell creates a closed circuit to the BL, draining the pre-charge voltage from the BL terminal.

Thus, the bias conditions in FIGS. 9 and 10b also result in a high potential (e.g., 2.0V) at the SB terminal and BL terminal of transistor 502a and a low potential (e.g., 0V) at the SB terminal and BL terminal of transistor 502b. With this bias, field punch-through leakage between these adjacent BL switch transistors may again occur. Leakage may occur from the higher biased transistor 502a to the lower biased transistor 502b.

It is noted that read operations in other implementations may use a constant bit line voltage during sensing. In these systems, however, a large difference in potential between adjacent BL switch transistors may still occur. For example, in some odd/even architectures even bit lines may be sensed at one time and odd bit lines sensed at another. In such examples, some BL switch transistors may be at a higher potential than other adjacent BL switch transistors, for example when pre-charging the even bit lines and not pre-charging the odd bit lines, or vice-versa. Accordingly, similar field punch-through leakage may occur in these and other modes of reading.

During erasing, each of the BL switch transistors for the block is biased the same to permit the block to be erased simultaneously. The gates of the BL switch transistors are biased to a deselect voltage Vdeselect to cut off each bit line from the read/write circuits. In one example, the deselect voltage Vdeselect is equal to Vdd (e.g., 2V), however, other voltages can be used so that the BL switch transistors are turned off during the erase operation. A relatively low positive voltage, in this case the Vdeselect voltage of Vdd=2V, is applied to the SB terminal of the BL switch transistors. It is noted that the deselect voltages for Vgate and Vsb may be different during erasing in other examples. An erase voltage is applied to the p-well region of the memory array during erasing. The erase voltage Vera couples to the bit lines during the erase operation which raises the BL terminal of the BL switch transistors to Vera as well.

Figure 10C:
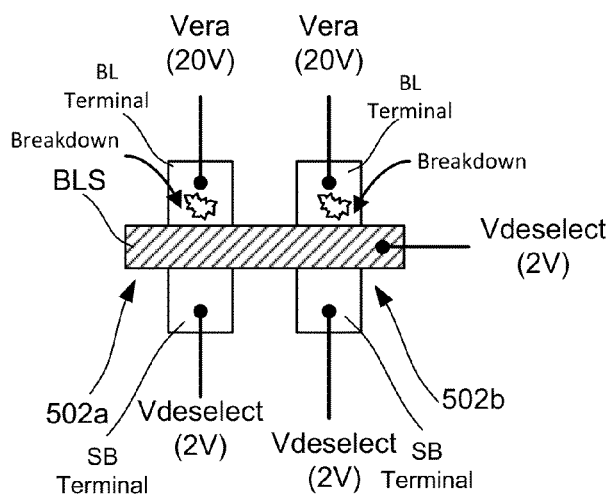

FIG. 10c is a schematic view of BL switch transistors 502a and 502b during an example of an erase operation. In this example, BL switch transistor 502a and BL switch transistor 502b, along with any additional bit lines of the block, are biased to enable erasing. The gate voltage Vgate of each transistor is set to the deselect voltage Vdeselect (e.g., 2V). Likewise, the SB terminal of each transistor is biased to Vdeselect (e.g, 2V) as well. The combination of voltages turns off each transistor which isolates the bit lines from the read/write circuits 230A. The bit lines are left in a floating condition, causing them to rise in accordance with the erase voltage. During erasing the bit lines and select gates at the NAND strings are floating. The erase voltage Vera is applied to the p-well of the memory array. The erase voltage couples to each bit line, raising the bit line voltage Vbl at the BL terminals to Vera. In one example, Vera is about 20V but various erase voltages may be used. In some embodiments, the erase voltage can be applied as one or more pulses with equal or increasing magnitudes for subsequent pulses, after verifying for example. Under the described biasing, a large potential exists between the BL terminals and the gates and SB terminals of each BL switch transistor. Under this high stress biasing, breakdown of the BL switch transistors may occur. For example, breakdown at the BL terminal may occur with a high voltage and potential existing with respect to the SB terminal and gate. Decreasing the amount of well dopant can increase the junction breakdown voltage. However, decreasing the amount of well dopants can lead to increases in the field punch-through leakage during program and read operations as earlier described.

Figures 11, 12:
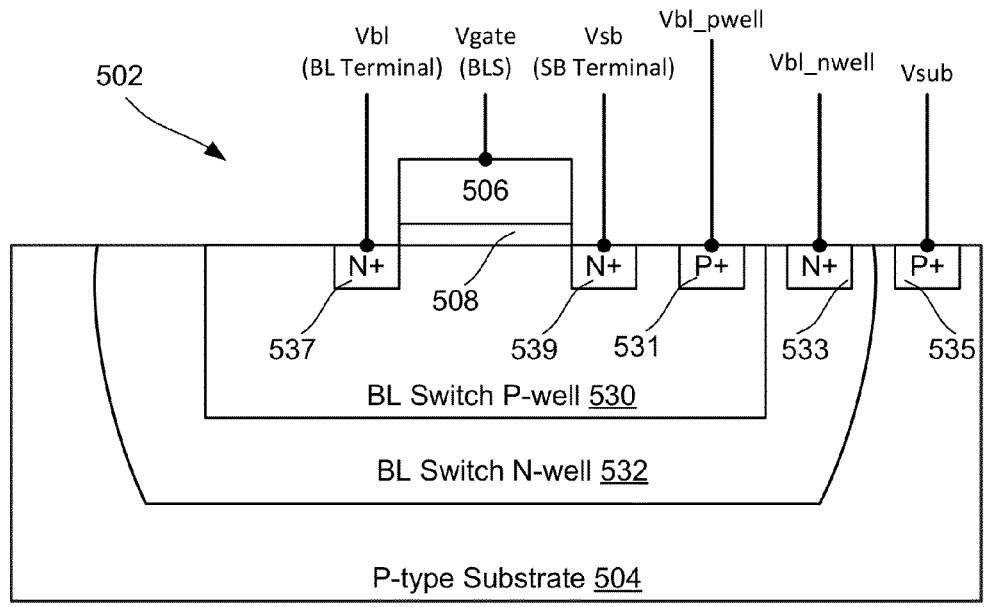
FIG. 11 is a cross-sectional view of a bit line switch transistor in accordance with an embodiment.
FIG. 12 is a table of bias conditions for operating the bit line switch transistor of FIG. 11 in an embodiment.

FIG. 11 depicts a bit line (BL) switch transistor 502 in accordance with an embodiment. The BL switch transistor may be used to provide a voltage to a bit line from a sense block. The BL switch transistor is implemented using a substrate 504 that employs a triple-well. In this example BL switch transistor is formed using a triple-well that includes the p-type substrate 504, within with is formed a BL switch n-well 532, within which is additionally formed a BL switch p-well 530. In one example, the p-type substrate 504 is a different part of the same p-type substrate 436 upon which the NAND strings are formed. In another example, p-type substrate 504 is different from p-type substrate 436, both being part of substrate 440. The BL switch p-well 530 and BL switch n-well 532 are separate from the array p-well 432 and the array n-well 434. In this manner, the BL switch p-well 530 and BL switch n-well 532 are electrically isolated from the array p-well 432 and array n-well 434. Therefore the BL switch p-well 530 and BL switch n-well 532 of the BL switch transistors may be biased independently of the array p-well 432 and array n-well 430.

The BL switch p-well 530 has a p+ region 531 in one embodiment which provides an electrical contact for applying the voltage Vbl_pwell to p-well region 530. The BL switch n-well region 532 has an n+ region 533 in one embodiment which provides an electrical contact for applying the voltage Vbl_nwell to region 532. The p-type substrate has a p+ region 535 in one embodiment which provides an electrical contact for applying the voltage Vsub to p-type substrate 504. In one embodiment, Vbl_pwell is a negative voltage during program and read operations and is a positive voltage during erase operations. This may be contrasted with the memory array p-well 432 which is typically grounded or at a small positive voltage during program and read and which is at a high positive voltage during erase. Vbl_pwell is not necessarily maintained at the same voltage and different values may be used for different operations. For example, a different negative voltage might be used for a program operation than for a read operation. In one embodiment, Vbl_nwell is set to Vdd (e.g., 2V) during program, read, and erase operations, however, other voltages can be used. In one embodiment, Vsub is ground or 0V so that the p-type substrate remains grounded while operating the memory device.

The BL switch transistor 502 includes two n+ regions 537 and 539. One of these n+ regions may form a source and the other may form a drain. These n+ regions may change such that they may be referred to generally as S/D regions. S/D region 537 forms the bit line (BL) terminal of the BL switch transistor and provides an electrical contact to one of the bit lines of the memory array 200. S/D region 539 forms the sense block (SB) terminal of the BL switch transistor and provides an electrical contact to one of the sense blocks 300. Electrical contacts may include vias, contacts, or any other connection from an n+ or p+ region (e.g., to a bit line or sense block). A voltage Vsb may be applied to the SB terminal and S/D region 539 from a corresponding sense block. BL switch transistor 502 includes a gate 506 formed over an oxide 508, although other dielectrics may be used. Gate 506 connects to or is formed from the BLS line. A voltage Vgate may be applied to the gate 506 vias the BLS line. In one embodiment, a select voltage Vselect is applied to gate 506 to turn on the BL switch transistor and deselect voltage Vdeselect is applied to gate 506 to turn off the BL switch transistor. The select voltage is approximately 8V in one example. The deselect voltage is approximately 2V (e.g., Vdd) in one example. Other select and unselect voltages can be applied to gate 506. Generally, when the BL switch transistor is turned on (Vgate=Vdeselect), the voltage applied at the SB terminal (Vsb) is passed to the BL terminal such as that Vbl is equal to Vsb. When the BL switch transistor is turned off (Vgate=Vdeselect), the corresponding bit line is isolated from the corresponding sense block such as that the bit line is floating.

FIG. 12 depicts a table 503 with voltages for biasing a BL switch transistor formed in a triple well in accordance with one embodiment. During programming, the gate voltage Vgate is raised to Vdeselect, e.g., by application on the bit line select line BLS. The sense block 300 for the corresponding bit line applies the program enable voltage Vpe or the program inhibit voltage Vpi depending on whether the memory cell of the corresponding bit line is to be programmed during application of a program voltage Vgpm to the selected word line. The appropriate voltage is applied as Vsb to the SB terminal of the corresponding BL switch transistor. For example, Vsb may be applied to n+ region 537.

The sense block applies a negative body bias to the BL switch transistor by applying a negative voltage to the BL switch p-well 530. In one embodiment, the negative voltage is applied to the p+ region 531 by setting Vbl_pwell to Vnbb. Various negative voltages may be used for Vnbb according to the requirements of a given implementation. In one example, Vnbb is −2V.

In one embodiment, the sense block applies Vnbb to the p-well of the BL switch transistors while applying the program enable and program inhibit voltages to the SB terminals of the BL switch transistors for a block. Further, the read/write circuits apply the select voltage (e.g., VX4) to the gate of the BL switch transistors while applying Vnbb to the p-well. These voltages are applied while applying one or more programming voltages to a selected word line and one or more pass voltages to unselected word lines. The negative BL pwell voltage Vbl_pwell creates a negative body bias for each BL switch transistor during programming. The negative body bias can help decrease the field punch-through leakage during programming. During programming, the memory array p-well 432 will typically be grounded, in contrast to the negative voltage at the BL switch p-well 530.

During read, the gate voltage Vgate is raised to Vselect, e.g., by application on the bit line select line BLS. The sense block 300 for the corresponding bit line applies a pre-charge voltage Vpc to the SB terminal by setting Vsb to Vpc. The select voltage turns on the BL switch transistor which passes the pre-charge voltage to the BL terminal of the BL switch transistor so that Vbl is equal to Vpc. The sense block applies a negative body bias to the BL switch transistor by applying a negative voltage to the BL switch p-well 530. In one embodiment, the negative voltage is applied to the p+ region 531 by setting Vbl_pwell to Vnbb. Various negative voltages may be used for Vnbb according to the requirements of a given implementation. In one example, Vnbb is −2V. The value of the negative voltage Vnbb during read may be different or the same as the value used during program. During read, the memory array p-well 432 will typically be grounded or set to a small positive voltage (e.g., 0-1.5V), in contrast to the negative voltage at the BL switch p-well 530.

In one embodiment, the sense block applies Vnbb to the p-well of the BL switch transistors while applying the pre-charge voltage to the SB terminals of the BL switch transistors for a block. The read/write circuits apply the select voltage to the gate of the BL switch transistors while applying Vnbb to the p-well. These voltages are applied while applying one or more read voltages to a selected word line and one or more pass voltages to unselected word lines. The negative BL pwell voltage Vbl_pwell creates a negative body bias for each BL switch transistor during read. The negative body bias can help decrease the field punch-through leakage during read.

For example, the bit lines corresponding to memory cells that are turned on during a sense operation may drain the pre-charge voltage as the NAND string provides a conduction path to the source line. For these BL switch transistors, their SB terminal and BL terminals are drawn to ground or 0V as the pre-charge voltage is drained. The bit lines corresponding to memory cells that are not turned during the sense operation may not drain the pre-charge voltage as the corresponding NAND string will not drain the pre-charge voltage. For these BL switch transistors, their SB terminal and BL terminals remain at the pre-charge voltage during sensing. This situation creates a different in potential between adjacent BL switch transistors when one transistor corresponds to a conducting cell and an adjacent transistor corresponds to a non-conducting cell. Leakage normally may be expected with a difference in potential between the terminals of the adjacent devices as shown in FIG. 10b. By applying Vnbb to the p-well of the transistors, however, the leakage may be reduced.

During erase, the gate voltage Vgate is raised to a deselect voltage Vdeselect, such as 2V (e.g, Vdd). The sense blocks 300 for a block being erased apply a deselect voltage such as Vdd to the SB terminals for the BL switch transistors for the block. The deselect voltage applied to the SB terminals can be different or the same as the deselect voltage applied to the gates. As earlier described, by setting the SB terminals and gates to low deselect voltages such as 2V, the BL switch transistors for the block are turned off. In this configuration, the BL switch transistors are turned off and the bit lines are floating. Consequently, the bit lines are raised to Vera as Vera is applied to the p-well 432 for the block of memory cells. The read/write circuits apply a positive body bias to the BL switch transistor by applying a positive voltage to the BL switch p-well 530. In one embodiment, the positive voltage is applied to the p+ region 531 by setting Vbl_pwell to Vpbb. Various positive voltages may be used for Vpbb according to the requirements of a given implementation. In one example, Vpbb is 2V. Other voltages may be used. During erase, the memory array p-well 432 will be at Vera, which is about 20V, in contrast to the small positive bias of about 2V applied to the BL switch p-well 530. Note that the positive bias for the BL switch p-well 530 may be larger than 2V, but will be lower than the erase voltage applied to the memory array p-well 432.

In one embodiment, the sense block applies Vpbb to the p-well of the BL switch transistors while applying the unselect voltages to the SB terminals and the gates of the BL switch transistors for a block. These voltages are applied while applying one or more erase voltages Vera to the p-well for the selected block and an erase enable voltage such as 0V to the word lines of the block. The positive BL pwell voltage Vbl_pwell creates a positive body bias for each BL switch transistor during erase. The positive body bias can help decrease the breakdown during erase.

Traditionally where a triple-well is not used, a large difference in potential exists across between the SB terminals and the BL terminals of the BL switch transistors. This large difference in potential can lead to junction breakdown at the BL terminals for example. By applying a positive voltage to the p-well. By applying Vpbb to the p-well of the transistors, however, the breakdown may be reduced. The positive body bias created by Vpbb will reduce the voltage difference between the BL terminal and the p-well which can help prevent the breakdown at the drain junction (BL terminal).

Figure 13:
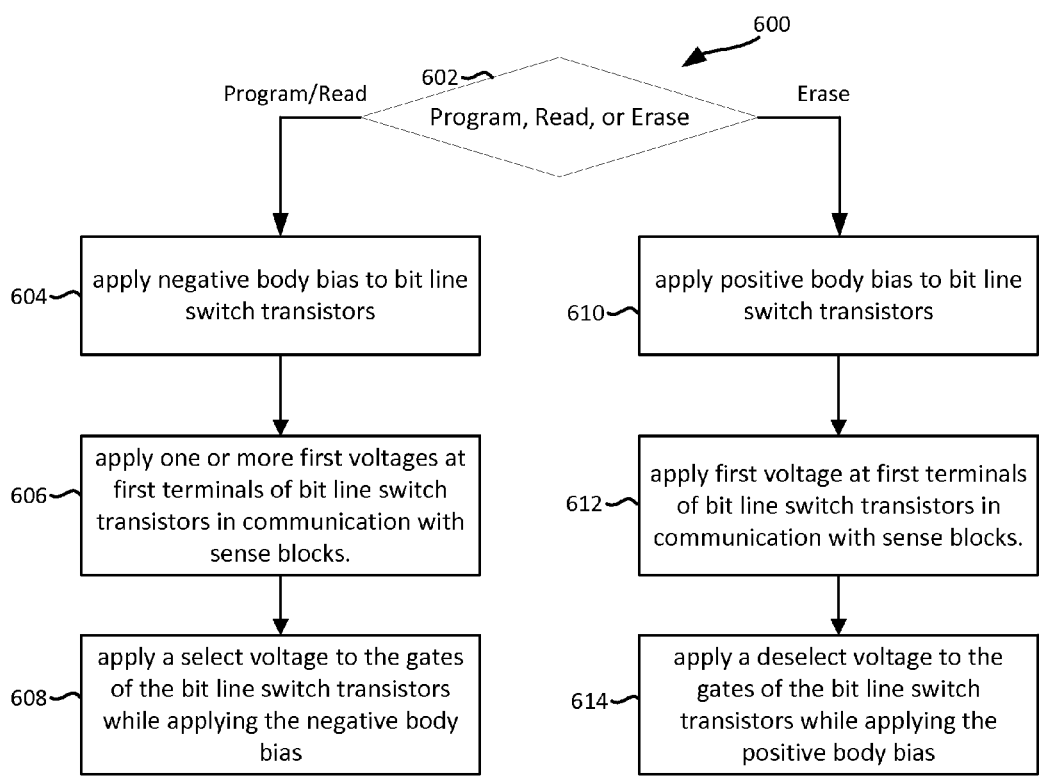
FIG. 13 is a flowchart describing a process of operating bit line switch transistors in accordance with an embodiment.

FIG. 13 is a flowchart describing a process of operating bit line switch transistors having a triple-well formation in accordance with one embodiment. In one example, read/write circuits 230A, 230B perform the process of FIG. 13 as part of programming, reading, or erasing a non-volatile memory array. Other circuits, however, can be used.

At step 602, the read/write circuits determine whether a program, read, or erase operation is being performed. If a program or read operation is being performed, the process continues at step 604. At step 604, a negative body bias is applied to the BL switch transistor for one or more blocks. For example, a negative voltage such as Vnbb can be applied to the substrate below the BL switch transistors. The negative voltage may be applied to a portion of the substrate, for example, by applying a voltage Vbl_pwell to a BL switch p-well contact region such as p+ region 531. The magnitude of the negative voltage may be different for a read or program operation in one example. In another example, the same negative voltage can be used.

At step 606, the read/write circuits apply one or more first voltages at a first terminal of each BL switch transistor. The first terminals are in communication with sense blocks for each of the corresponding bit lines in one example. The first terminals are SB terminals in one embodiment. For a program operation, the read/write circuits may apply a first voltage equal to a program enable voltage to some BL switch transistors and a first voltage equal to a program inhibit voltage to other BL switch transistors. For a read operation, the read/write circuits may apply a pre-charge enable voltage to the SB terminal of each BL switch transistor. The first voltages are applied from the sense block to the corresponding n+region for the SB terminal in one example.

In step 608, a select voltage is applied to the gates of the BL switch transistors 502 while applying the negative body bias and the one or more first voltages. In some embodiments, the select voltage is greater than the voltage to be passed to the word line by at least the threshold voltage of the BL switch transistor 502. The select voltage may applied by applying by setting Vgate to Vselect (e.g., 8V) for each BL switch transistor. The select voltage is selected to turn on each BL switch transistor while applying the first voltages. The select voltage may be different for program and read operations or the same.

Returning to step 602, if an erase operation is being performed the process continues at step 610. At step 610, a positive body bias is applied to the BL switch transistor for one or more blocks undergoing erase. For example, a positive voltage such as Vpbb can be applied to the substrate below the BL switch transistors. The positive voltage may be applied to a portion of the substrate, for example, by setting Vbl_pwell to Vpbb which will apply the positive voltage to a BL switch p-well contact region such as p+ region 531. The magnitude of the positive voltage may be different for different implementations. In one embodiment, the positive voltage is about 2V. For example, Vbl_pwell may be set to Vdd in one example.

At step 612, the read/write circuits apply a first voltage at the first terminals of each BL switch transistor. For an erase operation, the read/write circuits may apply a first voltage equal to Vdd or otherwise at about the same voltage applied to the p-well. The first voltage is a deselect voltage in one example.

At step 614, a deselect voltage is applied to the gates of the BL switch transistors 502 while applying the positive body bias and the first voltage. The deselect voltage may applied by applying Vdd to the bit line select line BLS, thus setting Vgate to Vdd for each BL switch transistor. The deselect voltage is selected to turn off each BL switch transistor while applying the first voltage.

In one embodiment the p-type substrate 504 is grounded during process 700. As noted above, the BL switch transistors 502 and the memory cells may be formed over the same p-type substrate 504. Also note that p-type substrate region 504 may stay grounded for all memory array operations. However, note that different biases may be applied to the BL switch p-well 530 for different operations.

In one embodiment, Vdd (e.g., 2V) is applied to the BL switch n-well region 532 during process 700. In one embodiment, BL switch n-well region 532 is kept at Vdd for all memory array operations. However, the voltage to BL switch n-well region 532 could be different for different memory array operations.

FIG. 14 is a flowchart describing a process 640 of programming non-volatile storage in accordance with one embodiment. For example, the process of FIG. 14 may be used while applying a single program pulse to a selected word line. Typically, programming is achieved by applying one or more program pulses, followed by a program verify. Another one or more program pulses may then be applied, followed by an additional verify. This process may be repeated until all or a sufficient number of memory cells are programmed. Thus, process 640 may be performed multiple times. Note that the steps of process 640 may be performed in any order and are not limited to the order depicted. FIG. 15a is a schematic diagram of a BL switch transistor and bias conditions for the transistor when the corresponding bit line of the transistor is selected for programming according to the process in FIG. 14. FIG. 15b is a schematic diagram of a BL switch transistor and bias conditions for the transistor when the corresponding bit line of the transistor is to be inhibited from programming according to the process of FIG. 14.

At step 642, a negative voltage is applied to the BL switch p-well, such as p-well 530. In one example, the negative voltage is Vnbb and is approximately −2V. The negative voltage is applied as the voltage Vbl_pwell in one embodiment to a contact such as to the BL switch p-well region 531 in FIG. 11.

At step 644, a select voltage is applied to the gates of the bit line switch transistors. For example, a select voltage Vselect can be applied to the bit line select line BLS, thereby setting Vgate to Vselect. Vselect is about 8V in one embodiment but other select voltages can be used.

At step 646, program enable voltage Vpe is applied to the selected bit lines for the selected block. The program enable voltage Vpe is applied to the SB terminals of the BL switch transistors for the selected bit lines. As shown in FIG. 15*a*, the sense block voltage Vsb is set to the program enable voltage Vpe for the selected bit line switch transistors. With the select voltage applied to the gates of the BL switch transistors, the sense block voltage Vsb is passed from the SB terminal to the BL terminal of the BL switch transistors.

The program inhibit voltage Vpi is applied to the SB terminals of the BL switch transistors for the unselected bit lines at step 648. As shown in FIG. 15*b*, the sense block voltage Vsb is set to the program inhibit voltage Vpi for the unselected bit line transistors. With the select voltage applied to the gates of the BL switch transistors for the unselected bit lines, the sense block voltage Vsb which is set to Vpi, is passed from the SB terminal to the BL terminal for these transistors.

At step 650, a pass voltage is applied to each of the unselected word lines of the block for the program operation. For example, a pass voltage Vpass may be applied to these word lines. At step 652, a program voltage such as a program voltage pulse Vpgm is applied to a selected word line of the block. In one embodiment, the program voltage and pass voltages are applied to the word lines while the negative voltage is applied to the p-well of the BL switch transistors, the program enable and program inhibit voltages are applied to the SB terminals of the bit line switch transistors, and the select voltage is applied to the gates of the bit line switch transistors.

After the program pulse is applied to the selected word line in the selected block, a verify operation can be performed. Then, process 640 may be repeated, typically with a program voltage of greater magnitude.

FIG. 16 is a flowchart describing a process 660 of reading non-volatile storage in accordance with one embodiment. For example, the process of FIG. 16 may be used while applying one or a series of read reference voltages Vcgry to a selected word line. Note that the steps of process 660 may be performed in any order and are not limited to the order depicted. FIG. 17*a* is a schematic diagram of a BL switch transistor and bias conditions when the memory cell of a corresponding BL and the selected word line is conductive during the sense operation. Thus, FIG. 17*a* corresponds to a memory cell having a threshold voltage at or below the read reference voltage applied to the selected word line. FIG. 17*b* is a schematic diagram of a BL switch transistor when the memory cell of a corresponding bit line and the selected word line is not conductive during the sense operation. Thus, FIG. 17*b* corresponds to a memory cell having a threshold voltage above the read reference voltage that is applied to the selected word line.

At step 662, a negative voltage is applied to the BL switch p-well, such as p-well 530. In one example, the negative voltage is Vnbb and is approximately −2V. The negative voltage is applied as the voltage Vbl_pwell in one embodiment to a contact such as to the BL switch p-well region 531 in FIG. 11. The negative voltage during the read operation may be the same or different than the negative voltage during the program operation.

At step 664, a select voltage is applied to the gates of the bit line switch transistors. For example, a select voltage Vselect can be applied to the bit line select line BLS, thereby setting Vgate to Vselect. Vselect is about 8V in one embodiment but other select voltages can be used. The select voltage during the read operation may be the same or different than the select voltage during the program operation.

At step 666, a pre-charge voltage Vpc is applied to the selected bit lines for reading. The pre-charge voltage Vpc is applied to the SB terminals of the BL switch transistors for the selected bit lines.

At step 668, a read pass voltage Vpass is applied to the unselected word lines of the block. Various read pass voltages may be used and the read pass voltages may vary by word line in one example. The read pass voltage is generally provided at a magnitude sufficient to ensure conduction through each of the unselected memory cells. At step 670, a read reference voltage Vcgry is applied to the selected word line.

The value of Vcgry may be incremented during the read operation. At step 672, the control circuits determine whether Vcgry should be incremented. Vcgry is generally set to each of the read compare voltages (VrA, VrB, etc.) during the read operation. During a verify operation the value of $V_{CGRV}$ may also be incremented. In one embodiment, Vcgry will be set to one or more of the verify compare voltages (VvA, VvB, etc.) during the verify operation. However, note that it is not required that all of the verify compare voltages be used during a single verify operation. This is because it may only be necessary to verify lower states early in programming, and higher states later in programming.

Process 660 returns to step 670 to apply the next read compare voltage Vcgry until all compare voltages have been applied. In one embodiment, the negative body bias is maintained at the same value by applying Vnbb while each read compare voltage is applied.

As shown in FIGS. 17*a* and 17*b*, the sense block voltage Vsb is set to the pre-charge voltage Vpc for the selected bit line switch transistors. With the select voltage VX4 applied to the gates of the BL switch transistors, the pre-charge voltage is passed from the SB terminal to the BL terminal of the BL switch transistors such that the BL terminal voltage Vbl is equal to the sense block voltage Vsb at the SB terminals.

With reference to FIG. 17*a*, the bit line voltage Vbl discharges from the precharge voltage Vpc to 0V for the bit lines having a conductive memory cell at a particular compare voltage. The conductive memory cell provides a path from the bit line to the source line, thus causing the bit line voltage to decrease form the precharge level. Because the BL switch transistor is turned on by the select voltage, the BL terminal and sense block voltage Vsb drain to 0V as well. Note that in other embodiments a constant bit line voltage sensing technique may be used. Nevertheless, a difference in voltage between adjacent BL switch transistors during read may occur is odd and even bit lines are read separately for example.

With reference to FIG. 17*b*, the bit line voltage Vbl does not discharge from the precharge voltage Vpc for the bit lines having a non-conductive memory cell at a particular compare voltage. The non-conductive memory cell causes an open circuit, thus disrupting the electrical path from the bit line to the source line. Because the BL switch transistor is turned on by the select voltage, the BL terminal and sense block voltage Vsb remain at the precharge voltage Vpc throughout sensing.

Figure 18:
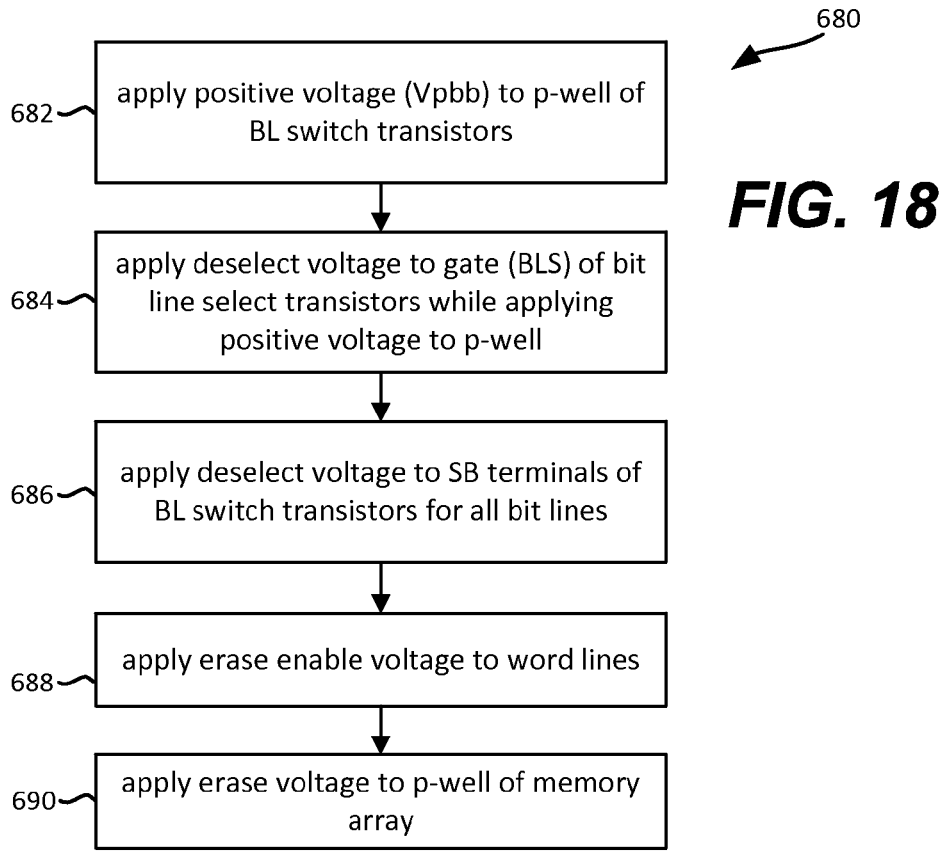
FIG. 18 is a flowchart describing a process of erasing non-volatile memory in an embodiment.
Figure 19:
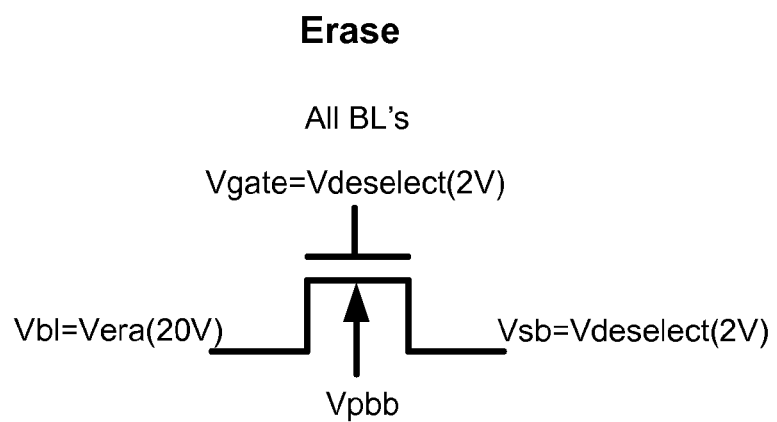
FIG. 19 depicts possible bias conditions applied to a bit line switch transistor during an erase operation.

FIG. 18 is a flowchart describing a process 680 of erasing non-volatile storage in accordance with one embodiment. For example, the process of FIG. 18 may be used while applying one or a series of erase voltage pulses to a selected block of memory cells. Note that the steps of process 680 may be performed in any order and are not limited to the order depicted. FIG. 19 is a schematic diagram of a BL switch transistor and bias conditions the during an erase operation that applies the bias conditions of FIG. 18.

At step 682, a positive voltage is applied to the BL switch p-well, such as p-well 530. In one example, the positive voltage is Vpbb and is approximately 2V. The positive voltage is applied as the voltage Vbl_pwell in one embodiment to a contact such as to the BL switch p-well region 531 in FIG. 11. Different magnitudes of the positive voltage may be used in different implementations. At step 684, a deselect voltage is applied to the gates of the bit line switch transistors. For example, a deselect voltage equal to 2V can be applied to the bit line select line BLS as shown in FIG. 19, by setting Vgate to Vdeselect.

At step 686, the deselect voltage is applied to the SB terminals of the BL switch transistors for the selected block. In one embodiment, the deselect voltages applied at steps 684 and 686 are different. In another embodiment, the deselect voltages are the same. With the deselect voltages applied to the SB terminal and gates of the BL switch transistors, the transistors are turned off to isolation the bit lines from the sense blocks. In this manner, the bit lines for the selected block are floating.

At step 688, an erase enable voltage is applied to the selected word line or word lines of the block. The erase enable voltage is ground or 0V in one embodiment. At step 690, an erase voltage Vera is applied to the p-well for the memory array. Note this is not the same p-well as p-well within which the BL switch transistors are formed. An example for the erase pulse is 20V. The positive voltage being applied to the BL p-well region may reduce or prevent junction breakdown as may occur without a body bias being applied to the BL switch transistors. After the erase pulse, a verify operation may be performed. Then, process 680 may be repeated. As earlier described, the positive voltage Vpbb applied to the BL switch p-well 530 is lower than the positive voltage Vera that is applied to the memory array p-well 432.

Figure 20:
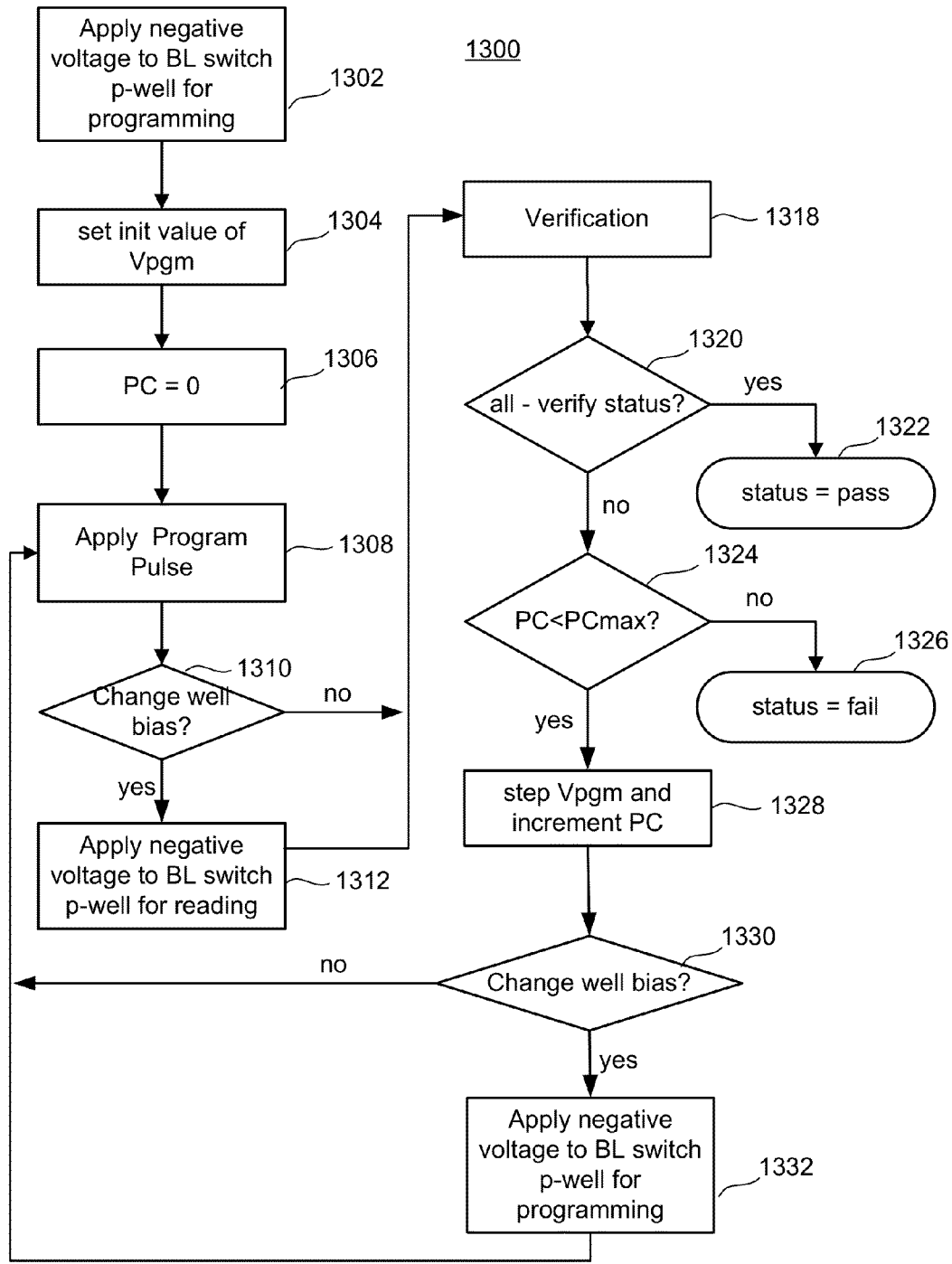
FIG. 20 is a flowchart describing a process of programming non-volatile memory in an embodiment.

FIG. 20 is a flow chart describing one embodiment of a process 1300 of programming memory cells. This process 1300 describes a number of program cycles, with verify operations performed after applying one or more program pulses. Process 1300 may be performed once for each word line in a selected block.

At step 1302, a negative voltage is applied to the BL switch p-well for programming. Step 1302 is one embodiment of step 642 of FIG. 14. At step 1304, the system will set the magnitude of the initial program pulse. At step 1306, the program count PC will be set to initially be zero. At step 1308, a program pulse is applied to the appropriate word line(s). At step 1310, a determination is made whether to change the well bias for a verify operation. For example, a different negative voltage may be applied to the p-well for verifying than is applied while programming. Note that the well bias could be maintained at the same level during at least some verify operations. As noted, the negative voltage is a small negative voltage in one embodiment.

If step 1312 is performed, the different negative voltage may be applied to the BL switch p-well region 530. Otherwise, the BL switch p-well region 530 remains biased at the level from step 1302. At step 1318, the memory cells to be programmed on the selected word line(s) are verified to see if they have reached the target threshold voltage level. If all or almost all of the memory cells to be programmed have reached the target threshold voltage level (step 1320), then the programming process has completed successfully (status=pass) in step 1322. If not all or almost all of the memory cells have been verified, then it is determined in step 1324 whether the program count PC is less than a maximum allowed number of attempts (PCmax). If the program count is not less than PCmax, then the programming process has failed (step 1326). If the program count is less than PCmax, than in step 1328, the magnitude of program voltage signal VPGM is incremented by the step size (e.g., 0.3V) for the next pulse and the program count PC is incremented. Note that those memory cells that have reached their target threshold voltage are locked out of programming for the remainder of the current programming cycle.

After step 1328, the process of FIG. 20 continues at step 1330 to determine whether to change the well bias for program operation. If the well bias remained at the same level during the verify operation, then there is no need to change the bias. In one embodiment, step 1332 includes applying the negative voltage originally applied at step 1302. After establishing or keeping the back bias, the next program pulse is applied in step 1308.

Figure 21:
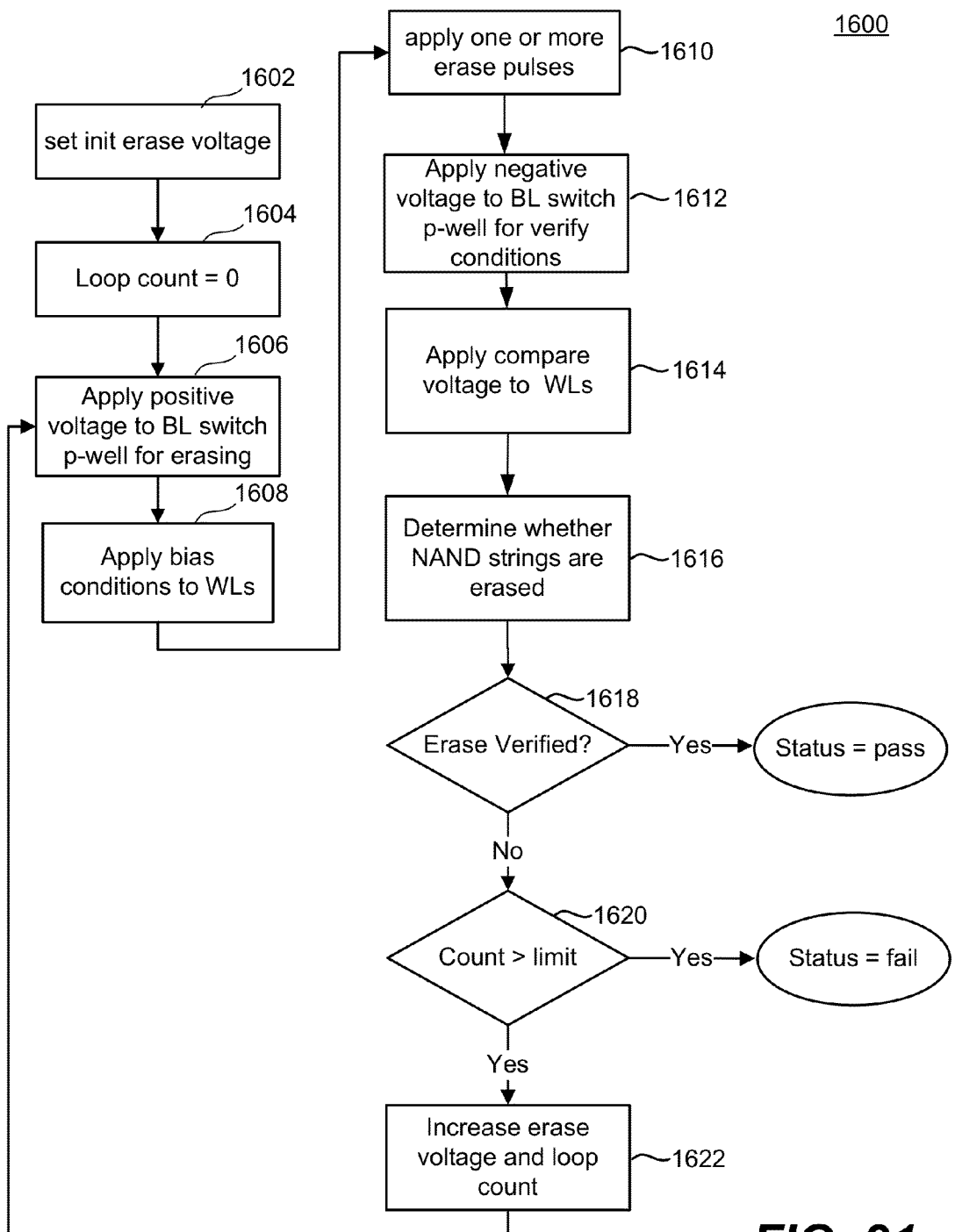
FIG. 21 is a flowchart describing a process of erasing non-volatile memory in an embodiment.

FIG. 21 is a flow chart describing one embodiment of a process 1600 for erasing memory cells. Process 1600 describes how verify operations may be performed between erase operations. In step 1602, the system will set the magnitude of the initial erase pulse. At step 1604, an erase loop count will be set to initially be zero.

In step 1606, the BL switch transistors are back biased by applying a positive voltage to their p-well. This was discussed with respect to step 682 of FIG. 18. In step 1608, bias conditions are applied to the word lines of the selected block. This was discussed with respect to step 688 of FIG. 18.

In step 1610, erase conditions are applied. This is one embodiment of step 690 of FIG. 18. In one embodiment, step 1610 includes raising the array p-well 432 to an erase voltage (e.g., 20 volts) for a sufficient period of time, maintaining the WL voltages in the selected block at 0V, while the source and bit lines are floating. Due to capacitive coupling, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells.

Note that the memory cells in the unselected blocks may be in the same array p-well region 432 as those in the selected block. Therefore, the erase pulse may also be applied to the p-well below memory cells in unselected blocks. However, for these memory cells, the word lines are not maintained at a steady voltage. Instead the switch transistors associated with the unselected blocks are off during erase and the word lines in the unselected blocks are allowed to float.

In step 1612, a back bias voltage is provided to the BL switch p-well for erase verify conditions. Note that during erase, memory cells may be erased to a negative threshold voltage. Step 1612 includes applying a negative voltage to the p-well of the BL switch transistors in one embodiment. The negative voltage is the same negative voltage applied to the p-well during reading in one embodiment.

In step 1614, a compare voltage is applied to the word lines in the selected block. In one embodiment, a negative compare voltage is used at step 1614. In step 1616, each of the NAND strings is sensed to determine whether the memory cells on the NAND string were sufficiently erased. In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 1618, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the erase status is set to pass and process 1600 ends.

If, at step 1620, it is determined that erase verification failed, then the loop count is checked (step 1620) to determine whether it is over a limit. If so, the erase status is set to fail and process 1600 ends. If the loop count is not over the limit, then the erase voltage is increased in step 1622. The erase voltage can be increased by any desired amount such as 0.2 V, 0.5 V, 1.0 V, etc. The loop count is incremented.

The foregoing detailed description has been presented for purposes of illustration and description. It is not intended to be exhaustive or to limit the disclosed technology to the precise forms disclosed. Many modifications and variations are possible in light of the above teaching. The described embodiments were chosen in order to best explain the principles of the disclosed technology and its practical application to thereby enable others skilled in the art to best utilize the disclosed technology in various embodiments and with various modifications as are suited to the particular use contemplated. It is intended that the scope of the application be defined by the claims appended hereto.

What is claimed is:

1. A non-volatile storage system, comprising:
a substrate including a first triple well region and a second triple well region, the first triple well region including a first well and a second well that are electrically isolated from a third well and a fourth well of the second triple well region;
a non-volatile memory array including a block of non-volatile storage elements arranged into rows and columns over the first triple well region;
a plurality of word lines, each word line is coupled to one or more rows of non-volatile storage elements;
a plurality of bit lines, each bit line is coupled to one or more columns of non-volatile storage elements;
a plurality of bit line switch transistors formed over the second triple well region, each bit line switch transistor includes a first terminal, a second terminal coupled to one of the bit lines, and a gate; and
one or more management circuits in communication with the non-volatile memory array, the one or more management circuits are configured to apply a negative voltage to the third well while applying a program voltage or a read reference voltage to a selected word line.

2. The non-volatile storage system of claim 1, wherein:
the one or more management circuits are configured to independently bias the first well and the third well.

3. A non-volatile storage system according to claim 1, wherein:
the first terminal of each bit line switch transistor is coupled to the one or more management circuits;
the one or more management circuits are configured to apply a program enable voltage to the first terminal of the bit line switch transistor for a selected bit line while applying the negative voltage; and
the one or more management circuits are configured to apply a select voltage to the gate of the bit line switch transistor for the selected bit line while applying the negative voltage.

4. The non-volatile storage system of claim 1, wherein:
the first triple well region includes the substrate, the first well is formed in the second well, the second well is formed in the substrate; and
the second triple well region includes the substrate, the third well is formed in the fourth well, the fourth well is formed in the substrate.

5. A non-volatile storage system:
an array of non-volatile storage elements formed over a first well in a substrate, the array is in communication with a plurality of word lines and a plurality of bit lines, the first well is formed in a second well;
a plurality of bit line switch transistors formed over a third well in the substrate, each bit line switch transistor includes a first terminal in communication with one or more of the bit lines, a second terminal, and a gate, the third well is formed in a fourth well; and
one or more management circuits in communication with the array and the bit line switch transistors, the one or more management circuits are configured to apply a select voltage to the gate of the bit line switch transistors to enable a first set of the bit lines, the one or more management circuits are configured to apply a first voltage to the second terminal of the bit line switch transistors for the first set of the bit lines and applies a negative voltage to the third well while applying the first voltage and applying the select voltage.

6. The non-volatile storage system of claim 5, wherein:
the first voltage is a program enable voltage;
the one or more management circuits are configured to apply the select voltage to enable the first set of the bit lines for programming;
the one or more management circuits are configured to apply an inhibit voltage to the second terminal of the bit line switch transistors for a second set of the bit lines, the program enable voltage is less than the inhibit voltage; and
the one or more management circuits are configured to apply a programming voltage to one or more of the word lines while applying the inhibit voltage, the program enable voltage, the select voltage, and the negative voltage.

7. The non-volatile storage system of claim 6, wherein:
the bit line switch transistors for the first set of bit lines pass the program enable voltage to the first set of bit lines; and
the bit line switch transistors for the second set of bit lines pass the inhibit voltage to the second set of bit lines.

8. The non-volatile storage system of claim 7, wherein:
the inhibit voltage is a positive voltage; and
the program enable voltage is ground.

9. The non-volatile storage system of claim 6, wherein:
the one or more management circuits are configured to apply a deselect voltage to the gate of the bit line switch transistors to isolate the first set of bit lines for erasing;
the one or more management circuits are configured to apply a second voltage to the second terminal of the bit line switch transistors for the first set of bit lines to isolate the first set of bit lines for erasing, the second voltage is a positive voltage; and the one or more management circuits are configured to apply a third voltage to the third well while applying the deselect voltage and applying the second voltage, the third voltage is a positive voltage.

10. The non-volatile storage system of claim 9, wherein:
the deselect voltage is a positive voltage that is less than the select voltage; and
the first terminal of the bit line switch transistors for the first set of bit lines are raised to an erase voltage while applying the second voltage, the deselect voltage, and the third voltage, the erase voltage is larger than the second voltage.

11. The non-volatile storage system of claim 10, wherein:
the second voltage and the third voltage are equal.

12. The non-volatile storage system of claim 5, wherein:
the one or more management circuits are configured to apply the select voltage to enable the first set of the bit lines for reading;
the first voltage is a pre-charge voltage that is positive and less than the select voltage; and
the one or more management circuits are configured to apply a read reference voltage to one or more of the word lines while applying the pre-charge voltage, the select voltage, and the negative voltage.

13. The non-volatile storage system of claim 12, wherein:
the first set of bit lines includes a first subset of bit lines corresponding to non-volatile storage elements that are programmed to the read reference voltage;
the first set of bit lines includes a second subset of bit lines corresponding to non-volatile storage elements that are not programmed to the read reference voltage;
the first subset of bit lines discharge to less than the pre-charge voltage during reading; and
the second subset of bit lines remain at the pre-charge voltage during reading.

14. A method of operating non-volatile storage, comprising:
applying a negative voltage to a bit line switch well formed in a substrate;
applying a first voltage to a first terminal of a bit line switch transistor that is formed over the bit line switch well of the substrate, the bit line switch transistor includes a second terminal coupled to a bit line of a non-volatile memory array, the non-volatile memory array is formed over an array well in the substrate, the bit line switch well is electrically isolated from the array well; and
applying a select voltage to the bit line switch transistor while applying the first voltage and the negative voltage.

15. The method of claim 14, wherein:
the bit line switch well is a bit line switch p-well that is formed in a bit line switch n-well;
the array well is an array p-well that is formed in an array n-well;
the bit line switch transistor is a first bit line switch transistor;
the first voltage is a program-enable voltage;
applying the select voltage to the first bit line switch transistor includes applying the select voltage to a second bit line switch transistor that is formed over the bit line switch p-well; and
the method further comprises applying a program-inhibit voltage to a first terminal of the second bit line switch transistor while applying the program-enable voltage and the negative voltage.

16. The method of claim 15, wherein:
the program enable voltage is a positive voltage;
the program inhibit voltage is ground; and the select voltage is a positive voltage that is higher than the program enable voltage.

17. The method of claim 15, further comprising:
applying a positive voltage to the bit line switch p-well;
applying an erase-enable voltage to the first terminal of the first bit line switch transistor and the first terminal of the second bit line switch transistor;
applying a deselect voltage to the first bit line switch transistor and the second bit line switch transistor; and
applying an erase voltage pulse to the array p-well while applying the positive voltage, the erase-enable voltage, and the deselect voltage, the erase voltage pulse is a higher positive voltage than the positive voltage applied to the bit line switch p-well.

18. The method of claim 14, wherein:
the first voltage is a read-enable voltage that is positive.

19. The method of claim 18, wherein the read-enable voltage is passed to the bit line by the bit line switch transistor, the method further comprises:
applying a read reference voltage to a selected word line;
discharging the bit line from the read-enable voltage when a non-volatile storage element associated with the bit line has a threshold voltage below the read reference voltage; and
maintaining the bit line at the read-enable voltage when the non-volatile storage element associated with the bit line has a threshold voltage above the read reference voltage.

20. The method of claim 18, further comprising:
applying a positive voltage to the bit line switch well;
applying a deselect voltage to the first terminal of the first bit line switch transistor and the first terminal of the second bit line switch transistor;
applying a deselect voltage to the gate of the first bit line switch transistor and the gate of the second bit line switch transistor; and
applying an erase voltage pulse to the array well while applying the positive voltage, the erase-enable voltage, and the deselect voltage, the erase voltage pulse is a higher positive voltage than the positive voltage applied to the bit line switch well.

21. A method of operating non-volatile storage, comprising:
applying a negative voltage to a third well that is formed in a fourth well in a substrate;
applying a program enable voltage to a first terminal of a first bit line switch transistor that is formed over the third well of the substrate, the first bit line switch transistor includes a second terminal coupled to a first bit line of a non-volatile memory array, the non-volatile memory array is formed over a first well in the substrate, the first well is formed in a second well in the substrate;
applying a program inhibit voltage to a first terminal of a second bit line switch transistor that is formed over the third well; and
applying a select voltage to the first bit line switch transistor and the second bit line switch transistor while applying the program enable voltage and the program inhibit voltage.

22. The method of claim 21, wherein applying the negative voltage is performed during programming of the non-volatile storage, the method further comprises:
applying the negative voltage to the third well during reading of the non-volatile storage;
applying a read-enable voltage to the first terminal of the first bit line switch transistor and the first terminal of the second bit line switch transistor while applying the negative voltage; and applying the select voltage to the first bit line switch transistor and the second bit line switch transistor while applying the negative voltage and the read-enable voltage.

* * * * *